United States Patent
Suhara

(10) Patent No.: US 7,612,570 B2
(45) Date of Patent: Nov. 3, 2009

(54) SURFACE-POTENTIAL DISTRIBUTION MEASURING APPARATUS, IMAGE CARRIER, AND IMAGE FORMING APPARATUS

(75) Inventor: Hiroyuki Suhara, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 11/847,790

(22) Filed: Aug. 30, 2007

(65) Prior Publication Data

US 2008/0056746 A1 Mar. 6, 2008

(30) Foreign Application Priority Data

Aug. 30, 2006 (JP) ............................. 2006-233005
Sep. 19, 2006 (JP) ............................. 2006-253048

(51) Int. Cl.
*G01R 31/305* (2006.01)
(52) U.S. Cl. ........................... 324/751; 399/21; 399/46; 399/48
(58) Field of Classification Search ................. 324/751; 399/21, 45–49
See application file for complete search history.

(56) References Cited

U.S. PATENT DOCUMENTS

| | | | |
|---|---|---|---|
| 5,834,766 A | 11/1998 | Suhara | |
| 6,081,386 A | 6/2000 | Hayashi et al. | |
| 6,175,240 B1 * | 1/2001 | Vallet | 324/751 |
| 6,329,826 B1 * | 12/2001 | Shinada et al. | 324/751 |
| 6,376,837 B1 | 4/2002 | Itabashi et al. | |
| 6,400,391 B1 | 6/2002 | Suhara et al. | |
| 6,442,357 B2 * | 8/2002 | Ishii | 399/66 |
| 6,477,338 B2 * | 11/2002 | Hisano et al. | 399/49 |
| 6,532,094 B2 | 3/2003 | Suhara | |
| 6,555,810 B1 | 4/2003 | Suhara | |
| 6,628,903 B1 * | 9/2003 | Ohori et al. | 399/21 |
| 6,701,612 B2 * | 3/2004 | Khandros et al. | 29/842 |
| 6,738,586 B2 * | 5/2004 | Kubota et al. | 399/48 |
| 6,744,545 B2 | 6/2004 | Suhara et al. | |
| 6,753,524 B2 * | 6/2004 | Matsui et al. | 250/310 |

(Continued)

FOREIGN PATENT DOCUMENTS

JP 2003-295696 10/2003

(Continued)

OTHER PUBLICATIONS

U.S. Appl. No. 11/866,758, filed Oct. 3, 2007, Suhara.

*Primary Examiner*—Ha Tran T Nguyen
*Assistant Examiner*—Richard Isla Rodas
(74) *Attorney, Agent, or Firm*—Oblon, Spivak, McClelland, Maier & Neustadt, L.L.P.

(57) ABSTRACT

A surface-potential distribution measuring apparatus includes an electron gun, an electron-beam optical system, an electron-emission panel, a detector, and a control system. The electron-beam optical system is located between the electron gun and a sample, and focuses a beam of electrons emitted from the electron gun to the surface of the sample. The electron-emission panel is located near the sample to be collided with at least part of the electrons via the sample, and emits secondary electrons corresponding to the number of collided electrons. The detector detects at least part of the secondary electrons. The control system obtains potential distribution on the surface of the sample based on a detection result obtained by the detector.

15 Claims, 30 Drawing Sheets

U.S. PATENT DOCUMENTS

| | | |
|---|---|---|
| 6,859,060 B2 * | 2/2005 | Neo et al. .................. 324/765 |
| 6,870,652 B2 | 3/2005 | Suhara et al. |
| 6,891,678 B2 | 5/2005 | Suhara |
| 6,999,208 B2 | 2/2006 | Suzuki et al. |
| 7,072,127 B2 | 7/2006 | Suhara et al. |
| 7,130,130 B2 | 10/2006 | Suhara |
| 2005/0179971 A1 | 8/2005 | Amada et al. |
| 2006/0051121 A1 * | 3/2006 | Matsusaka et al. ............ 399/70 |
| 2006/0262417 A1 | 11/2006 | Suhara |

FOREIGN PATENT DOCUMENTS

| | | |
|---|---|---|
| JP | 2003-305881 | 10/2003 |
| JP | 2005-166542 | 6/2005 |
| JP | 2005-221935 | 8/2005 |
| JP | 2005-283712 | 10/2005 |
| JP | 2006-10430 | 1/2006 |
| JP | 2006-84434 | 3/2006 |
| JP | 2006-172790 | 6/2006 |
| JP | 2006-344436 | 12/2006 |

* cited by examiner $|Vacc| \geqq |Vp|$ $|Vacc| < |Vp|$

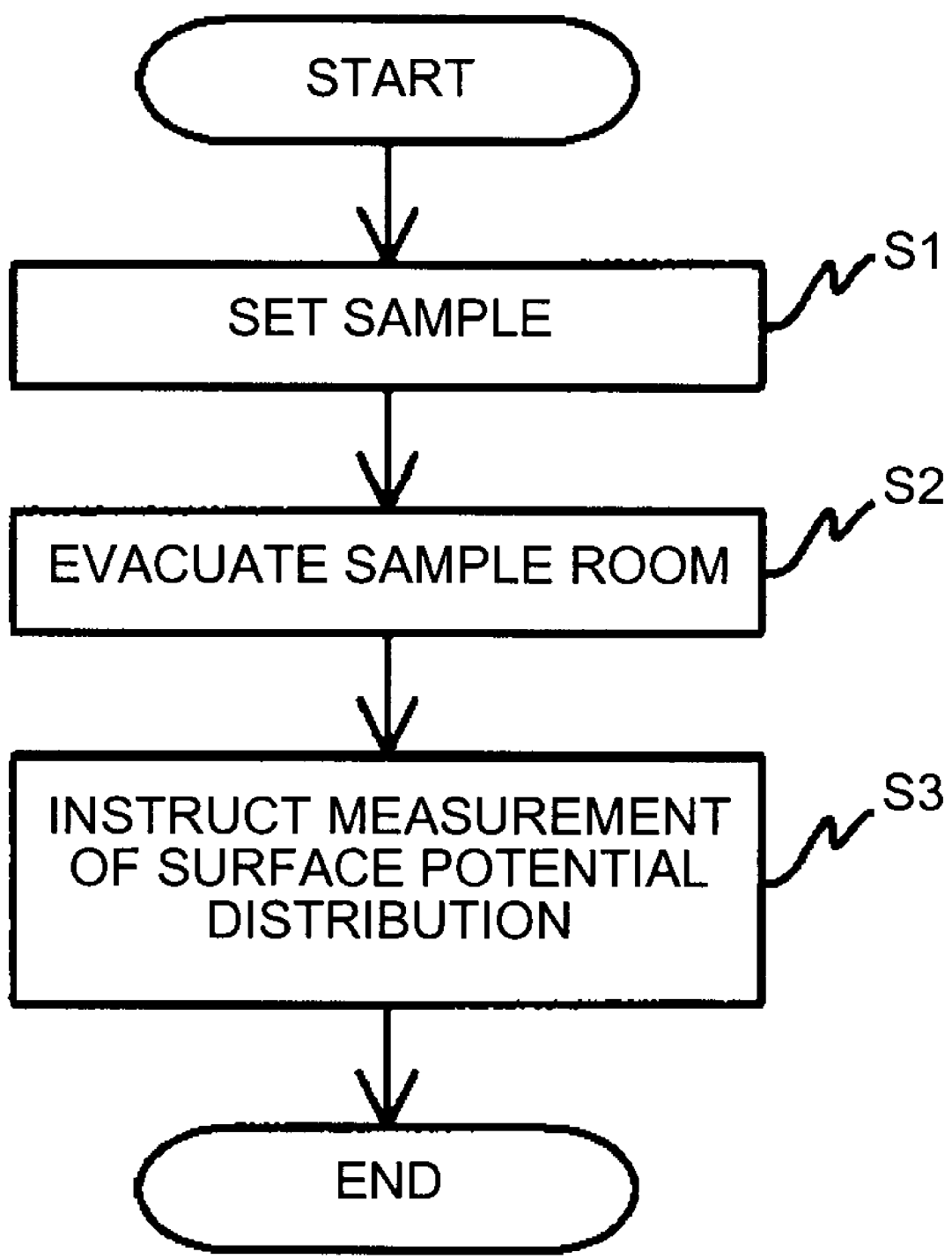

Vacc=-600V
(Vth)

Vacc=-750V
(Vth)

P5 →
P4 →
P3 →
P2 → (CORRESPONDING TO 600 dpi)
P1 → (CORRESPONDING TO 1,200 dpi)

BLACK PART:
LIGHT
SHIELDING PART
WHITE PART:
LIGHT TRANSMITTING
PART

HOLE-PLATE
SHAPE

HOLE-GRID
MESH SHAPE

GRID-MESH
SHAPE

GRID MESH

WHEN |Vacc|<|Vs|

REVERSED-PARTICLE
DETECTING MEMBER

CHARGED IMAGE
WHEN |Vacc|<|Vs|

SURFACE-POTENTIAL DISTRIBUTION MEASURING APPARATUS, IMAGE CARRIER, AND IMAGE FORMING APPARATUS

CROSS-REFERENCE TO RELATED APPLICATIONS

The present application claims priority to and incorporates by reference the entire contents of Japanese priority document, 2006-233005 filed in Japan on Aug. 30, 2006, and Japanese priority document, 2006-253048 filed in Japan on Sep. 19, 2006.

BACKGROUND OF THE INVENTION

1. Field of the Invention

The present invention relates to a surface-potential distribution measuring apparatus, an image carrier, and an image forming apparatus.

2. Description of the Related Art

Electrophotographic image forming apparatuses such as a laser printer and a digital copier focus light beams from a light source modulated according to image information on a photoconductor via a scanning optical system, and scans the light beams on the photoconductor in a predetermined direction (main scanning direction), thereby forming an electrostatic latent image on the photoconductor. The image forming apparatus makes toner adhere to the electrostatic latent image to obtain a toner image, and transfers the toner image onto a recording medium to form an output image.

The electrostatic latent image formed on the photoconductor affects the quality of the output image. Therefore, various technologies for evaluating the electrostatic latent image formed on the photoconductor are proposed. A result of the evaluation is fed back to the design of the image forming apparatus to improve the quality of the output image.

For example, Japanese Patent Application Laid-open No. H3-49143 has proposed a conventional technology of scanning a sample surface with an electron beam, and observing an electrostatic latent image using a secondary electron emitted by the scanning. The conventional technology requires time to prepare the observation. Therefore, when the sample is a normal dielectric substance that can permanently hold the charge, this sample can be observed. However, when the normal photoconductor is used as a sample, this sample cannot hold the charge during a long time, and, for example, the electrostatic latent image disappears at the observation preparation stage, making it impossible to accurately observe the sample.

The present applicant has proposed a method of measuring an electrostatic latent image that can be observed even when a photoconductor for use cannot hold the charge during a long time. Reference may be had to, for example, Japanese Patent Application Laid-open Nos. 2003-295696, 2003-305881, 2004-251800, and 2004-233261.

In recent years, along the rapid progress of digitalization of image information, demand for higher quality of the output image of the image forming apparatus is increasing. To meet this demand, further improvement in the precision of evaluation of the electrostatic latent image is desired.

A vibrating reed electrometer has been available as a commercial product can measure a potential of a few hundred to a few thousand volts in a potential resolution of a few volts. However, because a sensor probe needs to be set to a position with a distance from the sample in principle, space resolution is only a few millimeters or above, and the vibrating reed electrometer finds it difficult to measure a potential in a region of 1 millimeter or below.

Japanese Patent Laid-open No. H3-49143 discloses a conventional technology of observing the electrostatic latent image using an electron beam. According to this conventional technology, a sample to be observed is limited to a large-scale integration (LSI) chip and a sample that can store and hold the electrostatic latent image. That is, the normal photoconductor that generates a dark attenuation as described above cannot be measured. Because the normal dielectric substance can semi-permanently hold a charge, even when the potential is measured taking time after forming a charge distribution, a result of the measurement is not affected. However, because a resistance value of the photoconductor is not infinitely large, the photoconductor cannot hold the charge during a long time. As a result, a dark attenuation occurs, and the surface potential decreases along lapse of time. The photoconductor can hold a charge for about a few dozens of seconds at most in the dark room. Therefore, even when an electrostatic latent image is attempted to be observed with a scanning electron microscope (SEM) after charging and exposure, the electrostatic latent image disappears during the preparation stage.

As disclosed in Japanese Patent Application Laid-open No. 2003-295696, the present applicant has proposed a system that measures an electrostatic latent image even when a photoconductor sample has dark attenuation. That is, when a sample surface has a charge distribution, an electric field distribution corresponding to the surface charge distribution is formed in space. Therefore, this electric field pushes back a secondary electron generated by an incident electron (charged particle beam), and decreases the amount of beam reaching the detector. Accordingly, a part having strong electric field intensity has a dark contrast and a part having weak electric field intensity has a bright contrast, enabling a contrast image to be detected corresponding to the surface charge distribution.

Therefore, when the photoconductor sample is exposed with light, an exposed part turns black and a non-exposed part turns white, thereby forming an electrostatic latent image that can be measured.

Japanese Patent Application Laid-open Nos. 2003-305881, 2005-166542, and 2005-221935 also discloses conventional technologies for measuring an electrostatic latent image or surface-potential distribution using a charged particle beam.

However, with these conventional technologies, it has been difficult to measure a surface electrification and a surface potential in high resolution of a micron order, and there has been room for improvement in evaluating the electrostatic latent image formed on the photoconductor of the image forming apparatus.

SUMMARY OF THE INVENTION

It is an object of the present invention to at least partially solve the problems in the conventional technology.

According to an aspect of the present invention, a surface-potential distribution measuring apparatus that measures potential distribution on a surface of a sample by scanning the surface with a beam of charged particles, includes a beam generating unit that generates a beam of charged particles; an optical system that is located between the beam generating unit and the sample, and focuses the beam from the beam generating unit to the surface of the sample; a particle emitting member that is located near the sample to be collided with at least part of the charged particles via the sample, and emits secondary charged particles corresponding to number of collided charged particles; a detecting unit that detects at least part of the secondary charged particles; and a calculating unit that calculates potential distribution on the surface of the sample based on a detection result obtained by the detecting unit.

According to another aspect of the present invention, an image carrier having an insulation resistance that satisfies a predetermined condition. The insulation resistance is obtained by a surface-potential distribution measuring apparatus that measures potential distribution on a surface of the image carrier by scanning a surface of a sample of the image carrier with a beam of charged particles. The surface-potential distribution measuring apparatus includes a beam generating unit that generates a beam of charged particles; an optical system that is located between the beam generating unit and the sample, and focuses the beam from the beam generating unit to the surface of the sample; a particle emitting member that is located near the sample to be collided with at least part of the charged particles via the sample, and emits secondary charged particles corresponding to number of collided charged particles; a detecting unit that detects at least part of the secondary charged particles; and a calculating unit that calculates potential distribution on the surface of the sample based on a detection result obtained by the detecting unit.

According to still another aspect of the present invention, an image forming apparatus includes an image carrier having an insulation resistance that satisfies a predetermined condition, an optical scanning device that scans the image carrier with light, and a transfer unit that transfers an image formed on the image carrier onto a transfer material. The insulation resistance is obtained by a surface-potential distribution measuring apparatus that measures potential distribution on a surface of the image carrier by scanning a surface of a sample of the image carrier with a beam of charged particles. The surface-potential distribution measuring apparatus includes a beam generating unit that generates a beam of charged particles; an optical system that is located between the beam generating unit and the sample, and focuses the beam from the beam generating unit to the surface of the sample; a particle emitting member that is located near the sample to be collided with at least part of the charged particles via the sample, and emits secondary charged particles corresponding to number of collided charged particles; a detecting unit that detects at least part of the secondary charged particles; and a calculating unit that calculates potential distribution on the surface of the sample based on a detection result obtained by the detecting unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 6 and 7 are flowcharts of a process of measuring a surface potential distribution;

DETAILED DESCRIPTION OF THE PREFERRED EMBODIMENTS

Exemplary embodiments of the present invention are explained in detail below with reference to the accompanying drawings.

Figure 1:
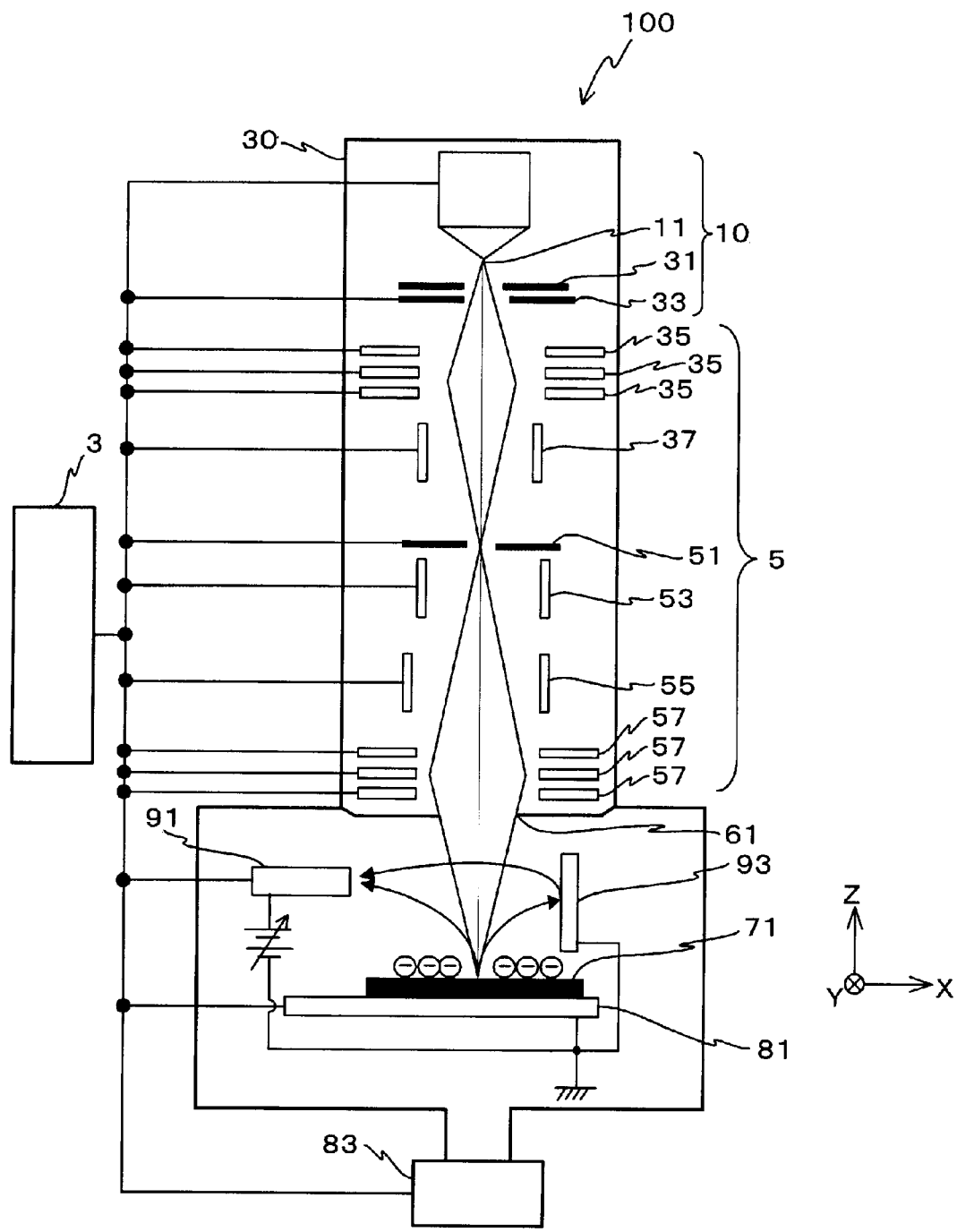
FIG. 1 is a schematic diagram of a surface-potential distribution measuring apparatus according to a first embodiment of the present invention.

A first embodiment of the present invention is explained below with reference to FIGS. 1 to 9C. FIG. 1 is a schematic diagram of a surface-potential distribution measuring apparatus 100 according to the first embodiment.

The surface-potential distribution measuring apparatus 100 includes an electron gun 10, a casing 30, a condenser lens (electrostatic lens) 35, a beam-blanking electrode 37, an aperture 51, a stigmator 53, a scanning lens (deflection electrode) 55, an objective lens 57, a sample table 81, a detector 91, an electron-emission panel 93, a control system 3, an exhaust system 83, and a driving power source (not shown). In the following description, an optical axis direction of each lens is explained as a Z-axis direction, and two directions mutually orthogonal within a plane perpendicular to the Z-axis direction are explained as an X-axis direction and a Y-axis direction.

The electron gun 10 emits an electron beam. The electron gun 10 includes an emitter 11, an extraction electrode 31, and an acceleration electrode 33.

The extraction electrode 31 is disposed at the –Z side of the emitter 11, and is applied with a voltage to generate a strong electric field to the emitter 11. Accordingly, an electron beam is emitted from the front end of the emitter 11. In the first embodiment, it is assumed that the electron beam is emitted toward the –Z direction.

The acceleration electrode 33 is disposed at the –Z side of the extraction electrode 31, and is applied with a voltage (acceleration voltage Vacc) that gives desired energy to the electron beam emitted from the emitter 11.

The condenser lens 35 is disposed at the –Z side of the acceleration electrode 33, and narrows down the electron beam.

The beam-blanking electrode 37 is disposed at the –Z side of the condenser lens 35, and turns on/off the electron beam.

The aperture 51 is disposed at the –Z side of the beam-blanking electrode 37, and prescribes a beam diameter of the electron beam from the beam-blanking electrode 37.

The stigmator 53 is disposed at the –Z side of the aperture 51, and corrects an astigmatism.

The scanning lens 55 is disposed at the –Z side of the stigmator 53, and deflects the electron beam from the stigmator 53.

The objective lens 57 is disposed at the –Z side of the scanning lens 55, and focuses the electron beam from the scanning lens 55 on the surface of a sample 71 via a beam-emission opening 61.

Hereinafter, the optical system including the condenser lens 35, the beam-blanking electrode 37, the aperture 51, the stigmator 53, the scanning lens 55, and the objective lens 57 is also referred to as an electron-beam optical system 5.

The sample table 81 is mounted with the sample 71 thereon, and can be moved two-dimensionally within the XY plane based on a driving mechanism (not shown). This sample table 81 has conductivity, and is grounded. The sample 71 can have a plane or curved surface.

The electron-emission panel 93 is disposed at a position opposite to the detector 91, by sandwiching the optical axis of the electron-beam optical system 5 so that at least part of the electron to be detected, proceeding to an opposite direction of the detector 91 and not drawn by the detector 91, collides against the surface of the electron-emission panel 93. When the electron collides against the surface, the electron-emission panel 93 emits a secondary electron. Because the secondary electron has low energy, the secondary electron can reach the detector 91 based on the drawing voltage of the detector 91. The electron-emission panel 93 has conductivity, and is grounded. Therefore, accumulation of charge is suppressed, and the energy of the secondary electron is suppressed at a low level, and the detector 91 can easily draw the secondary electron. When the incident electron collides against the electron-emission panel 93, the electron-emission panel 93 emits a secondary electron. When the secondary electron collides against the electron-emission panel 93, the electron-emission panel 93 emits a third-order electron. When the third-order electron collides against the electron-emission panel 93, the electron-emission panel 93 emits a forth-order electron. Therefore, in this description, the nth electron is referred to as "secondary electron".

Figure 2:
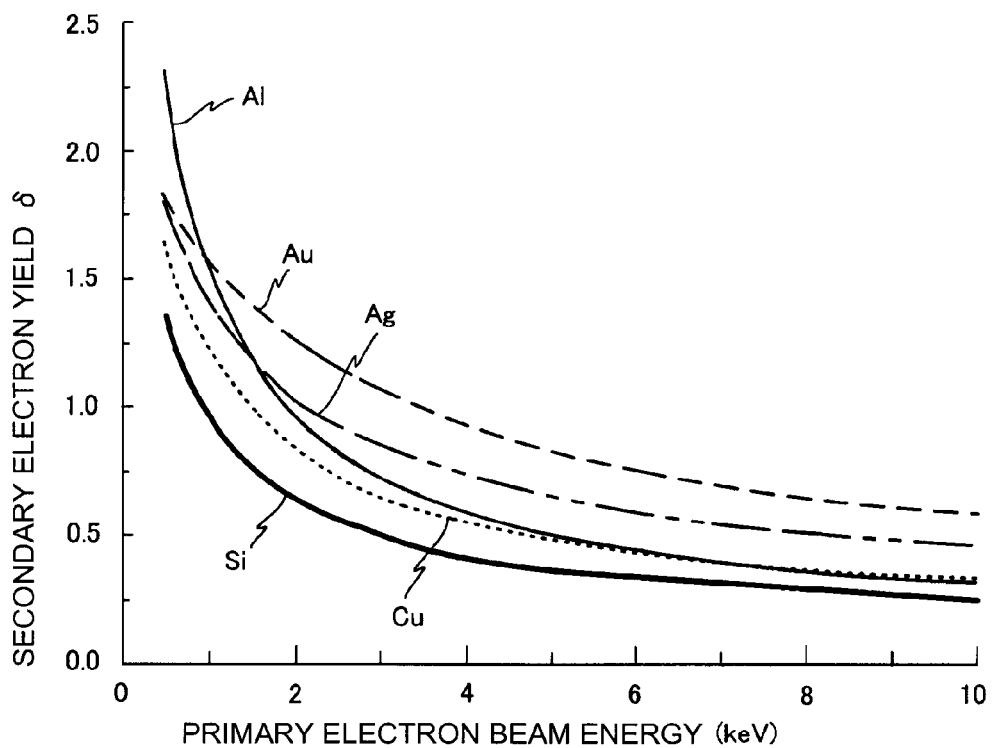
FIG. 2 is a graph for explaining a secondary electron-emission ratio of each substance.

In this case, it is desirable that the secondary electron-emission ratio of the electron-emission panel 93 is equal to or larger than 0.5 and is equal to or smaller than 2 so that there is not a large difference between a detection result when the electron to be detected directly reaches the detector 91 and a detection result when the electron to be detected reaches the detector 91 via the electron-emission panel 93. As an example, FIG. 2 depicts secondary electron-emission ratios of aluminum (Al), copper (Cu), silver (Ag), gold (Au), and silicon (Si). The secondary electron-emission ratios depend on the energy of the incident electron. The energy of the incident electron can be considered as a potential difference (absolute value) between the surface potential of a sample and the surface potential (0 volt, in this example) of the electron-emission panel 93. For example, when the surface potential is –1,000 volts, the potential difference becomes 1,000 volts, and electron to be detected enters the electron-emission panel 93 in the energy of 1 kiloelectron volt (keV). In this case, the secondary electron-emission ratios of Al, Cu, Ag, Au, and Si are 1.5, 1.2, 1.4, 1.6, and 1.0, respectively, and Cu and Si are particularly suitable. When the potential difference is 2,000 volts, the electron to be detected is incident to the electron-emission panel 93 in the energy of 2 keV. In this case, the secondary electron-emission ratios of Al, Cu, Ag, Au, and Si are 0.95, 0.8, 1.0, 1.25, and 0.65, respectively, and Ag is particularly suitable. When the potential difference is 600 volts, the electron to be detected is incident to the electron-emission panel 93 in the energy of 0.6 keV. In this case, the secondary electron-emission ratios of Al, Cu, Ag, Au, and Si are 2.3, 1.7, 1.75, 1.7, and 1.25 respectively, and Al is not suitable.

Figure 3:
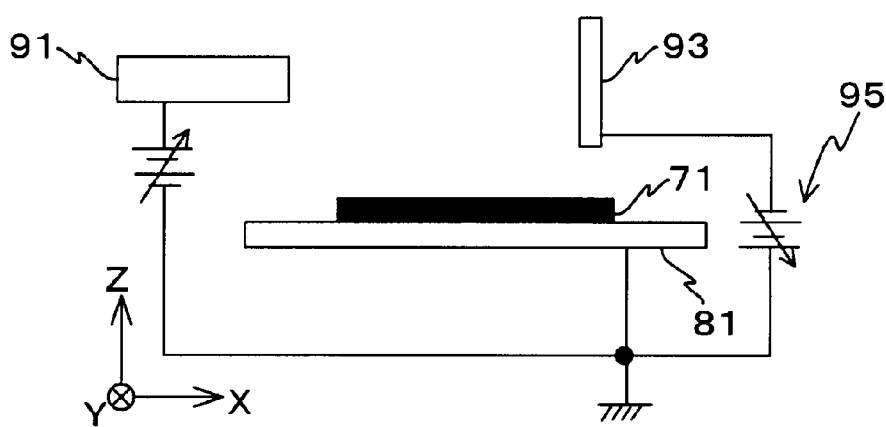
FIG. 3 is a schematic diagram for explaining application of a voltage to an electron-emission panel shown in FIG. 1.

As an example, a power source 95 for applying a voltage to the electron-emission panel 93 can be additionally provided to optimize the secondary electron-emission ratio, as shown in FIG. 3. For example, assume that the electron-emission panel 93 is made of Cu, and the incident electron energy that makes the secondary electron-emission ratio 1 is 750 volts. In this case, when the surface potential of the sample 71 is −1,000 volts, the application of a voltage of −250 volts to the electron-emission panel 93 makes the secondary electron-emission ratio 1, making it possible to obtain a preferable image contrast.

Referring back to FIG. 1, the detector 91 is disposed near the sample 71, and acquires part of the electron (hereinafter, also "primary repulsive electron") repulsed near the surface of the sample 71 before reaching the surface of the sample 71, and the secondary electron emitted from the electron-emission panel 93. That is, in the first embodiment, the primary repulsive electron is the electron to be detected, as one example. A scintillator and a photomultiplier tube are used for the detector 91. A positive voltage (e.g., 10 kilovolts) is applied to the detector 91, to increase detection sensitivity.

The electron gun 10, the electron beam optical system 5, the electron-emission panel 93, the sample table 81, and the detector 91 are accommodated in the casing 30. This casing 30 includes a body tube accommodating the electron gun 10 and the electron beam optical system 5, and a vacuum chamber accommodating the electron-emission panel 93 and the sample table 81.

The exhaust system 83 includes plural exhaust devices, and sets the inside of the casing 30 to a high vacuum state. In the present example, while air is exhausted from a lower side (−Z side) of the casing 30, air can be exhausted from plural places instead of one place.

The control system 3 includes a computer, an input device, a display device, and a printer. The computer executes a computer program installed in advance to control the electron gun 10, the electron beam optical system 5, the sample table 81, and the exhaust system 83, and obtains the surface potential distribution of the sample 71 based on the output signal of the detector 91. In the first embodiment, the surface potential of the sample 71 is assumed as negative.

Figure 4A:
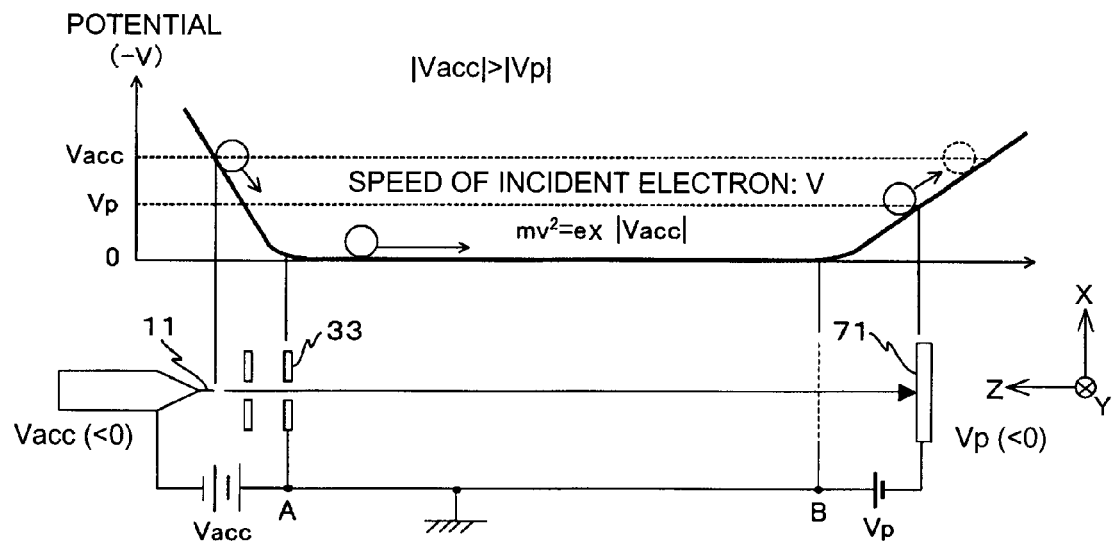
FIGS. 4A and 4B are schematic diagrams for explaining a relation between an acceleration voltage and a potential on a sample surface.
Figure 4B:
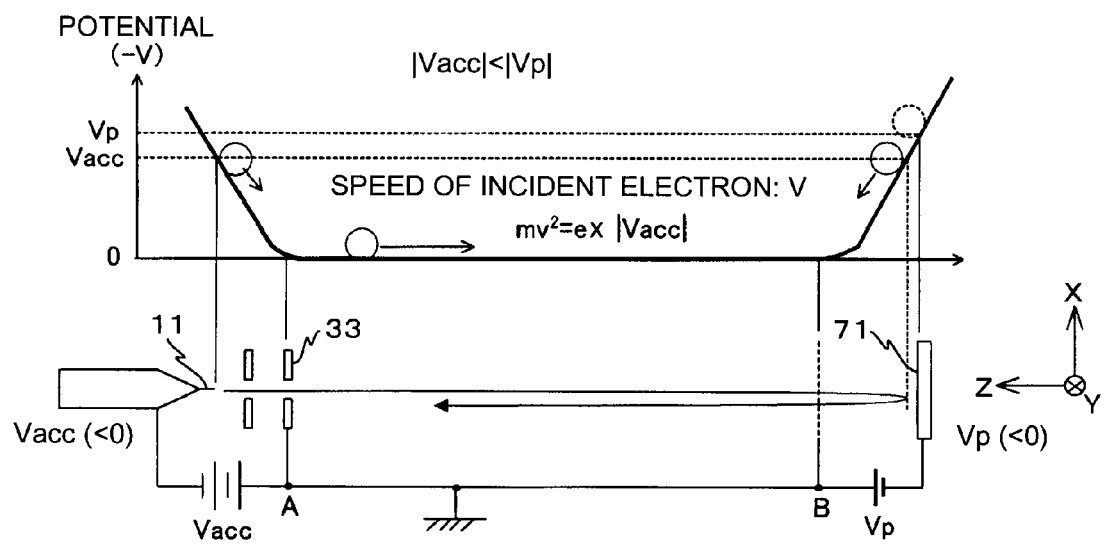

FIGS. 4A and 4B are schematic diagrams for explaining a relation between the acceleration voltage Vacc of the electron (hereinafter, also "incident electron") emitted to the sample 71 and the surface potential of the sample 71.

A surface potential at the position where the incident electron is applied to the surface of the sample 71 is set as Vp (<0). It can be assumed that the voltage Vp is applied to between a point B and the surface of the sample 71. In FIGS. 4A and 4B, the potential is shown as electric position energy that a unit charge has.

During a section (between A and B) where the potential is 0 volt, the incident electron moves to a direction of the surface of the sample 71 at a speed corresponding to the acceleration voltage Vacc, without being influenced by the surface potential Vp. After the point B, the incident electron receives the influence of the surface potential Vp.

The influence of the surface potential Vp to the incident electron is greatly different depending on a size relation between the acceleration voltage Vacc and the surface potential Vp.

(1) When |Vacc|>|Vp|

Figure 5A:
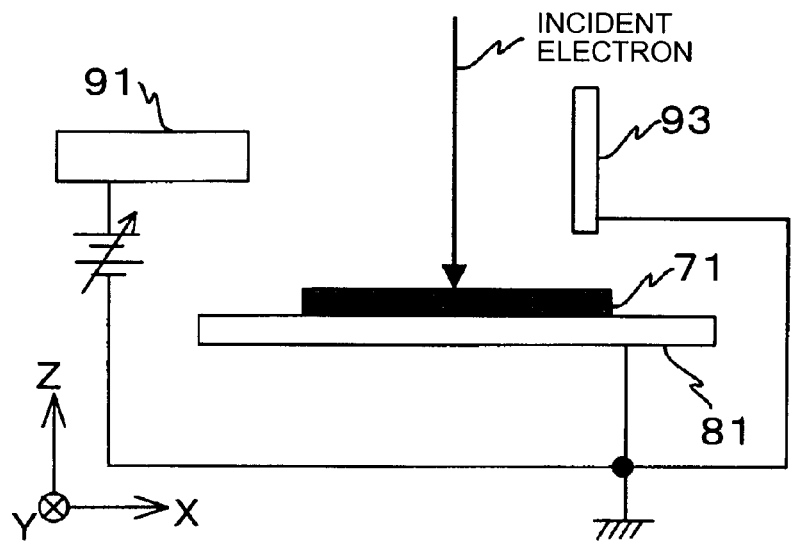
FIGS. 5A and 5B are schematic diagrams for explaining a behavior of an incident electron based on each acceleration voltage.

In this case, as shown in FIG. 4A, after passing the point B, the speed of the incident electron gradually decreases, and most of the incident electron reaches the surface of the sample 71. Therefore, as shown in FIG. 5A, for example, the detector 91 does not detect the primary repulsive electron.

(2) When |Vacc|<|Vp|

Figure 5B:
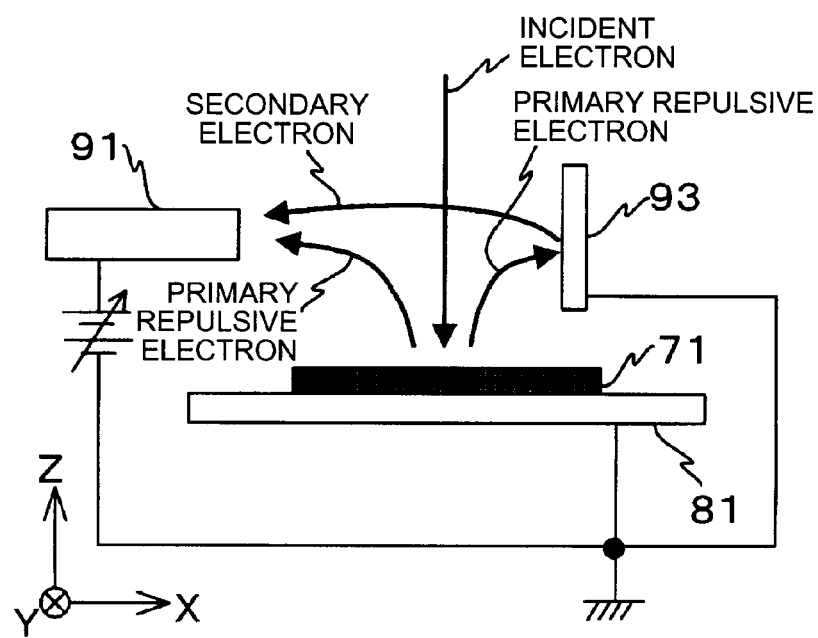

In this case, as shown in FIG. 4B, after passing the point B, the speed of the incident electron gradually decreases, and the speed becomes zero before reaching the sample 71. Starting from the position of zero, the incident electron proceeds to a direction (+Z direction) of leaving the surface of the sample. That is, the speed vector of the incident electron in the Z-axis direction is inverted before reaching the surface of the sample 71, and the incident electron returns without reaching the surface of the sample 71. The detector 91 detects, as a primary repulsive electron, part of the incident electron that does not reach the surface of the sample 71, as shown in FIG. 5B, for example. The primary repulsive electron proceeding toward the electron-emission panel 93 collides against the electron-emission panel 93, and generates a secondary electron. The detector 91 then detects this secondary electron.

A "reflection electron" used for observation and analysis with a scanning electron microscope (SEM) is part of electrons scattered on the front surface or on a slightly inside the surface of a sample, and escaped to space, and is quite different from the "primary repulsive electron" in this description. For details of such reflection electron, reference may be had to, for example, "Surface Analysis Dictionary", The Surface Science Society of Japan, Kyoritsu Shuppan Co., Ltd., p. 235, 1986.

Figure 7:
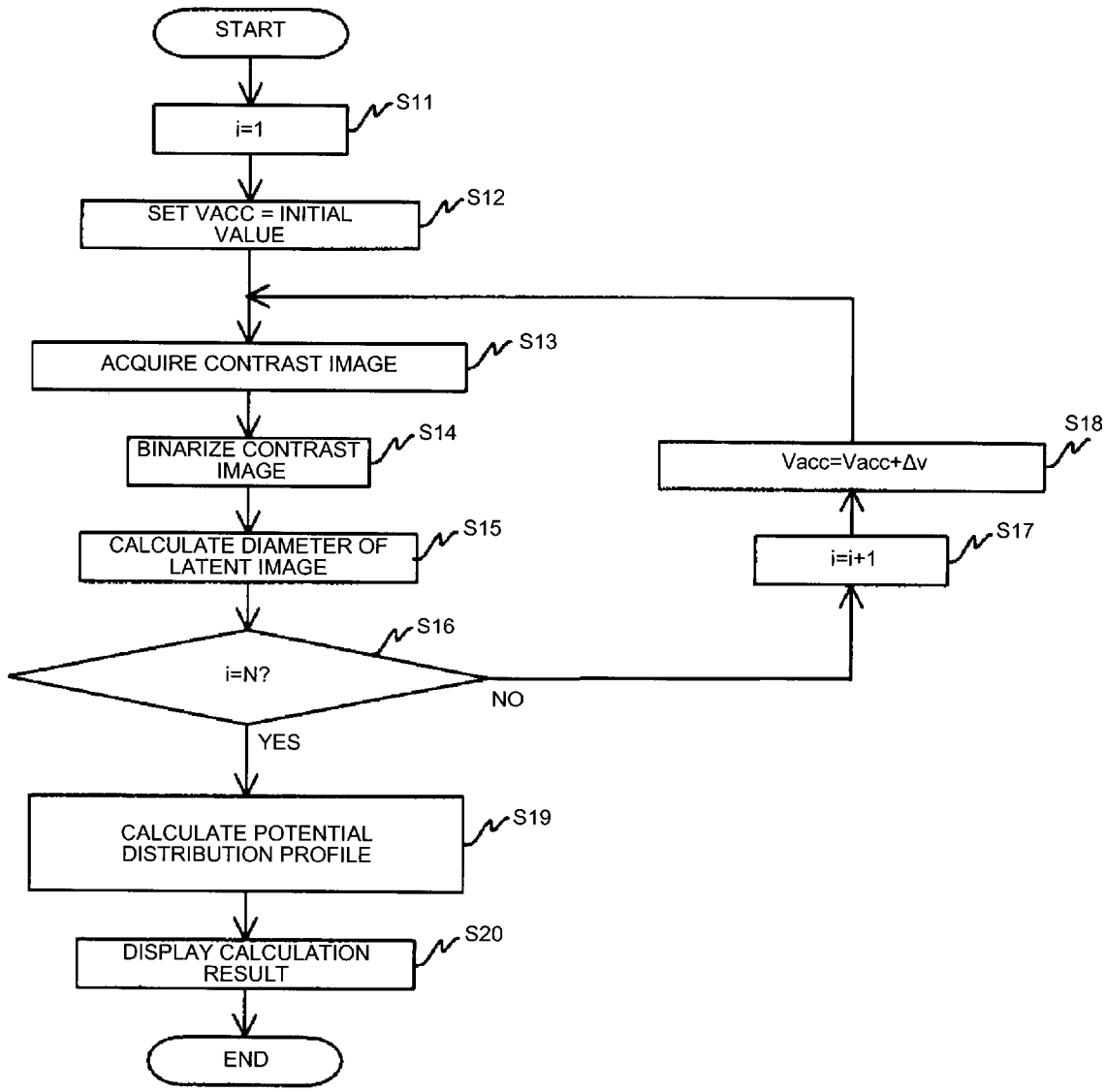

A process of measuring the surface potential distribution of the sample 71 with the surface-potential distribution measuring apparatus 100 having the above configuration is explained below with reference to FIG. 6 to FIG. 8C. FIG. 6 is a flowchart of an operation performed by the operator, and FIG. 7 is a flowchart of an operation performed by the computer of the control system 3. It is assumed that the XY surface of the sample 71 is scanned two dimensionally.

The sample 71 formed with a latent image is mounted on the sample table 81 (step S1). The exhaust system 83 is operated to set the inside of the casing 30 to a high vacuum state (step S2). Measurement of the surface potential distribution is instructed to the computer of the control system 3 (step S3). Thus, the operation performed by the operator ends.

Figure 8A:
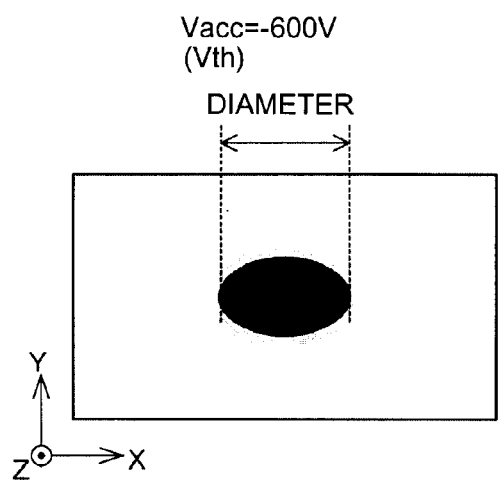
FIGS. 8A and 8B are schematic diagrams for explaining contrast images.
Figure 8B:
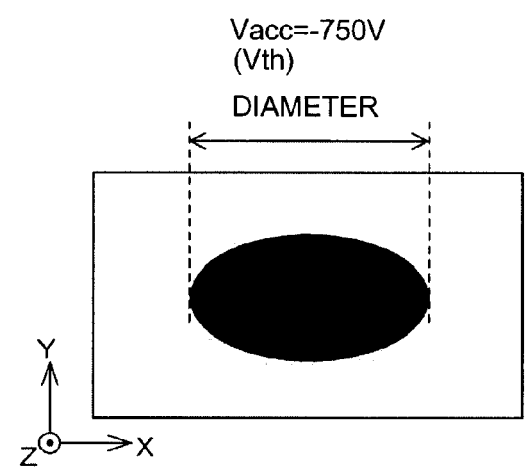

Upon receiving the instruction to measure the surface potential distribution, the computer of the control system 3 sets a counter i to an initial value 1 to count the number of repetition times (step S11). The computer sets the acceleration voltage Vacc to an initial value set in advance (step S12). The computer acquires a contrast image as shown in FIGS. 8A and 8B (step S13). A white region of the contrast image is the one where the detector 91 detects a large amount of electrons. A black region is the one where the detector 91 detects a small amount of electrons. At a boundary between the white region and black region, the output signal of the detector 91 changes greatly. When Vacc=−750 V (see FIG. 8B), the speed of the incident electron is faster than that when Vacc=−600 V. Therefore, the region where the incident electron is reversed decreases, and the black region increases.

Then, the contrast image is binarized (step S14) to obtain binary data. For example, in measuring a distribution state of the surface potential in the X-axis direction and the Y-axis direction, binary data is obtained in the X-axis direction and the Y-axis direction.

The diameter of the latent image is calculated based on the binary data (step S15). For example, in measuring a distribution state of the surface potential in the X-axis direction and the Y-axis direction, the diameter of the latent image is calculated in the X-axis direction and the Y-axis direction. The calculated diameter is stored in the memory (not shown) by relating the diameter to the acceleration voltage Vacc.

It is determined whether the value of the counter i reaches the value N (N: an integer equal to or larger than 2) set in advance (step S16). When the value of the counter i is yet to reach N (No at step S16), the process control proceeds to step S17. The value of the counter i is incremented by 1 (step S17).

The acceleration voltage Vacc is incremented by a predetermined amount (Δv) (step S18). The process control then returns to step S13.

Thereafter, the process from steps S13 to S18 is repeated until the determination at step S16 becomes affirmative.

When the value of the counter i reaches the value N (YES at step S16), the process control proceeds to step S19.

Figure 8C:
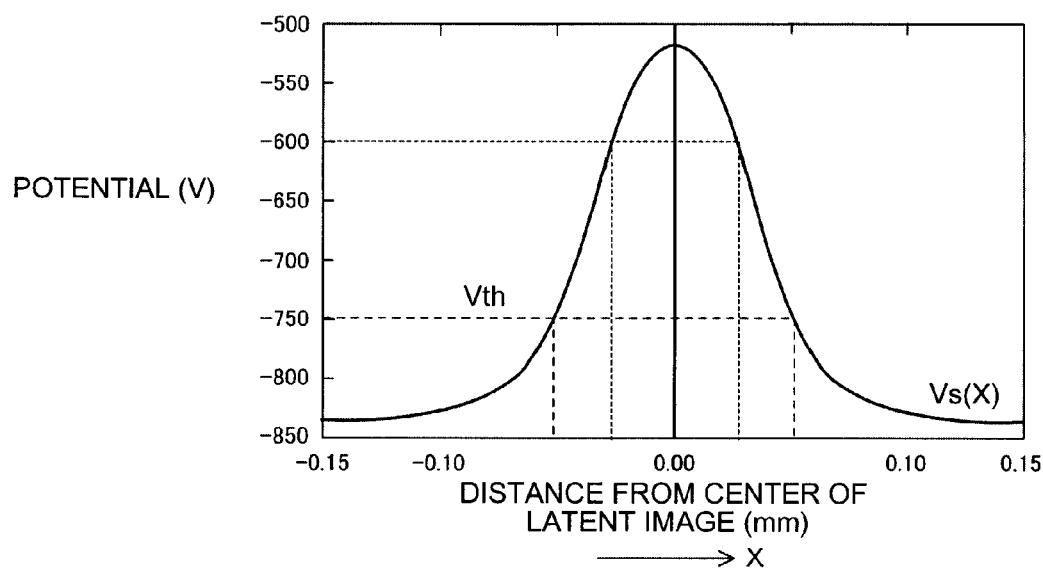
FIG. 8C is a graph for explaining potential distribution profile.

A surface potential distribution profile is calculated to obtain a distribution as shown in FIG. 8C, for example, based on the data (the diameter of the latent image at each acceleration voltage Vacc) showing the surface potential distribution stored in the memory (step S19).

The calculation result is displayed on the display device (step S20). The obtaining of the surface potential distribution ends there.

FIG. 8C is a graph of potential distribution profile in the X-axis direction. It is clear from FIG. 8C that the potential of the center (x=0) of the latent image is about −520 volts, and that the potential increases in the negative direction toward the outside, and becomes about −830 volts at the periphery where |x| is equal to or larger than 0.1 millimeter. In this case, the operator can also instruct a direction of the potential distribution profile displayed on the display device. The potential distribution profile can be also displayed three dimensionally. Further, the printer can print the calculation result.

At the request of the operator, a surface charge distribution and a surface charge distribution profile of the sample 71 can be obtained based on the result of the above measurement.

Figure 9A:
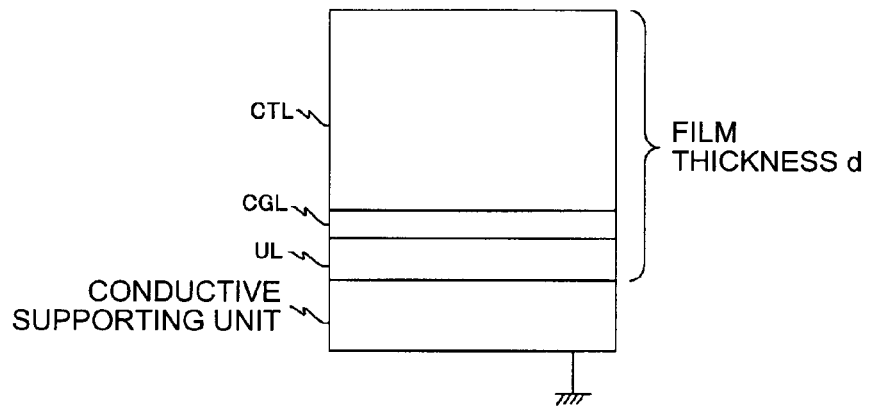
FIG. 9A is a schematic diagram for explaining a structure of a photoconductor.
Figure 9B:
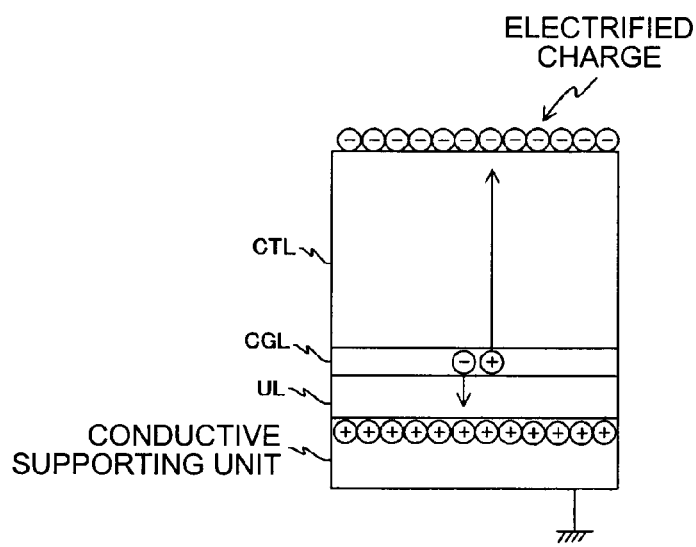
FIGS. 9B and 9C are schematic diagrams for explaining potential distributions.

An example of a method of forming an electrostatic latent image on the surface of a photoconductor when the photoconductor is used as the sample 71 is explained. The photoconductor has an under layer (hereinafter, "UL"), a charge generation layer (hereinafter, "CGL"), and a charge transportation layer (hereinafter, "CTL") laminated in this order on a conductive supporting unit, as shown in FIG. 9A, as an example. When the photoconductor surface is exposed with light in the state that this surface is charged (hereinafter, also "electrified charge"), as shown in FIG. 9B, a charge generation material of the CGL absorbs the light, and generates a charge carrier of both positive and negative polarities. Part of the carrier is injected into the CTL, and the other part of the carrier is injected into the conductive supporting unit. The carrier injected into the CTL moves from the inside of the CTL to the surface of the CTL based on the electric field, is coupled with the charge on the surface of the photoconductor, and disappears (see FIG. 9C). The UL is what is called a hole block layer, and has a function of blocking the injection of the charge from the conductive supporting unit. As a result, a charge distribution or an electrostatic latent image is formed on the surface of the photoconductor.

As is clear from the above explanation, the surface-potential distribution measuring apparatus 100 according to the first embodiment achieves processing by executing the computer program on the computer of the control system 3. The processing can be performed, partly or wholly, by hardware.

In the first embodiment, the electron gun 10 configures a beam generating unit, the electron beam optical system 5 configures an optical system, the electron-emission panel 93 configures an electron emission member, and the detector 91 configures a detecting unit.

As explained above, the surface-potential distribution measuring apparatus 100 according to the first embodiment includes the electron gun 10 that generates an electron beam, the electron beam optical system 5 that is disposed between the electron gun 10 and the sample 71 and that focuses the electron beam from the electron gun 10 onto the surface of the sample 71, the electron-emission panel 93 that is disposed near the sample 71 and that emits a secondary electron according to the electron via the sample 71, the detector 91 that is disposed near the sample 71 and that detects the secondary electron emitted from the electron-emission panel 93, and the control system 3 that obtains a distribution state of the surface potential of the sample 1 based on the result of the detection performed by the detector 91.

The surface of the sample 71 is scanned with the electron beam emitted from the electron gun 10 at each acceleration voltage, based on various acceleration voltages. The detector 91 detects both the primary repulsive electron that is repulsed near the surface of the sample 71 before reaching the surface of the sample 71 and the secondary electron that is the primary repulsive electron collided against the electron-emission panel 93 and is emitted from the electron-emission panel 93. Accordingly, the information amount used to obtain the surface potential distribution increases, thereby improving the S/N ratio of the output signal of the detector 91, and suppressing a variation in the concentration of contrast images. As a result, the surface potential distribution and the surface charge distribution of the sample 71 can be measured in high precision. Particularly, the electrostatic latent image can be measured in the micron order.

Because the surface-potential distribution measuring apparatus 100 according to the first embodiment detects the primary repulsive electron, the surface-potential distribution measuring apparatus 100 can achieve a quantitative measurement of a potential depth, and can measure the potential distribution in high precision.

Because the surface-potential distribution measuring apparatus 100 according to the first embodiment sets the secondary electron-emission ratio of the electron-emission panel 93 to equal to or larger than 0.5 and equal to or smaller than 2, the surface-potential distribution measuring apparatus 100 can obtain satisfactory image contrasts.

Figure 10:
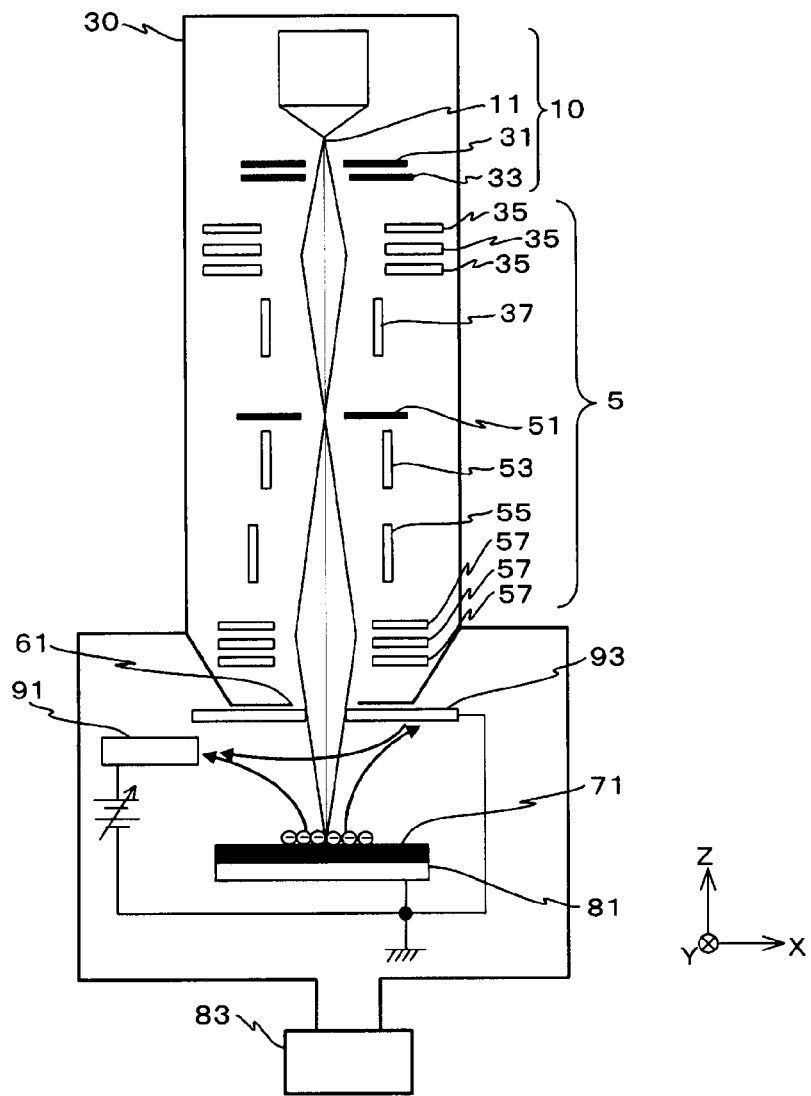
FIG. 10 is a schematic diagram for explaining a first modification of the electron-emission panel shown in FIG. 1.
Figure 11:
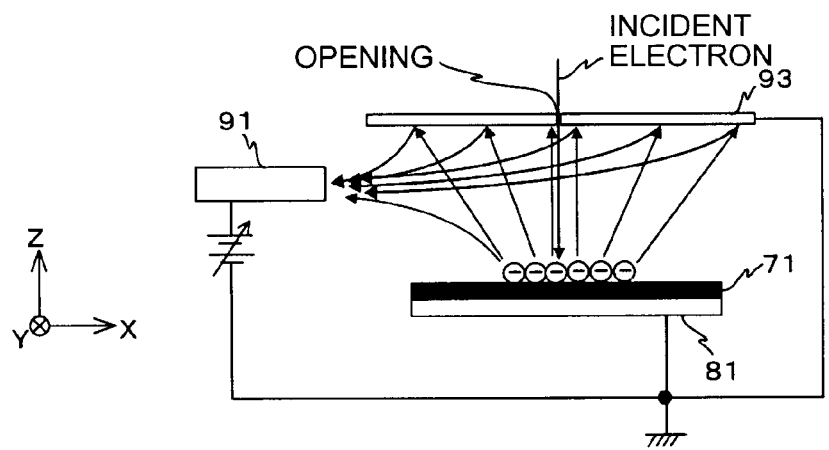
FIG. 11 is an enlarged view of part of the electron-emission panel shown in FIG. 10.

The electron-emission panel 93 is disposed opposite to the detector 91 in the first embodiment. However, as shown in FIGS. 10 and 11, the electron-emission panel 93 can have an opening through which the incident electron can pass, and can be disposed opposite to the sample 71 between the electron beam optical system 5 and the sample 71.

Figure 12A:
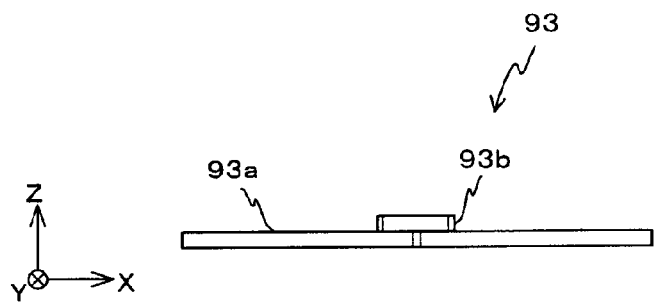
FIGS. 12A and 12B are schematic diagrams for explaining the electron-emission panel shown in FIG. 10.
Figure 12B:
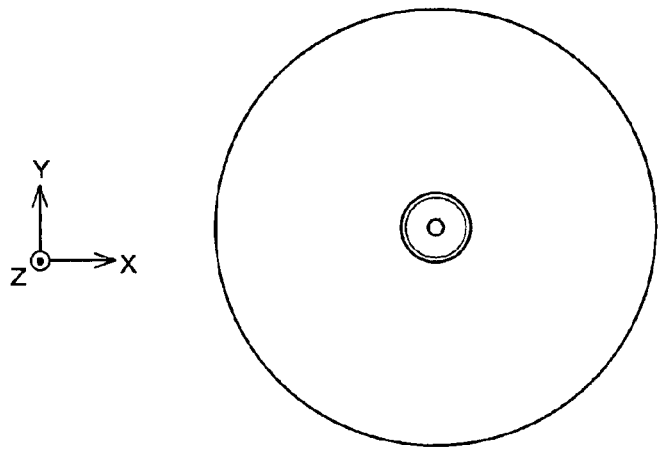

In this case, when the electron-emission panel 93 includes an emission-particle generation member 93a and a fitting member (fitting screw) 93b, with the emission-particle generation member 93a formed in a thin disk shape, as shown in FIGS. 12A and 12B, as one example, the layout space can be easily secured within the vacuum chamber of the casing 30. Further, an electric discharge between the detector 91 and the emission-particle generation member 93a can be suppressed, because of small presence of corners. A control system is not shown in FIG. 12A.

When a diameter of the opening (hereinafter, also "opening diameter") of the electron-emission panel 93 is set equal to or smaller than 2 millimeters, a return of the primary repulsive electron, that should originally reach the detector 91, to the beam-emission opening 61 can be suppressed, thereby improving the S/N ratio of the outputs signal of the detector 91. When the opening diameter is smaller, this can suppress the proceeding of the emission electron (the secondary electron, in this case) to the beam-emission opening 61. However, when the opening diameter is too small, the scanning area of the incident charged particle (the incident electron, in this case) is limited. Therefore, to secure a minimum scanning area, the opening diameter is preferably equal to or larger than 0.1 millimeter. The beam-emission opening 61 usually has the opening diameter equal to or larger than 5 millimeters.

Figure 13:
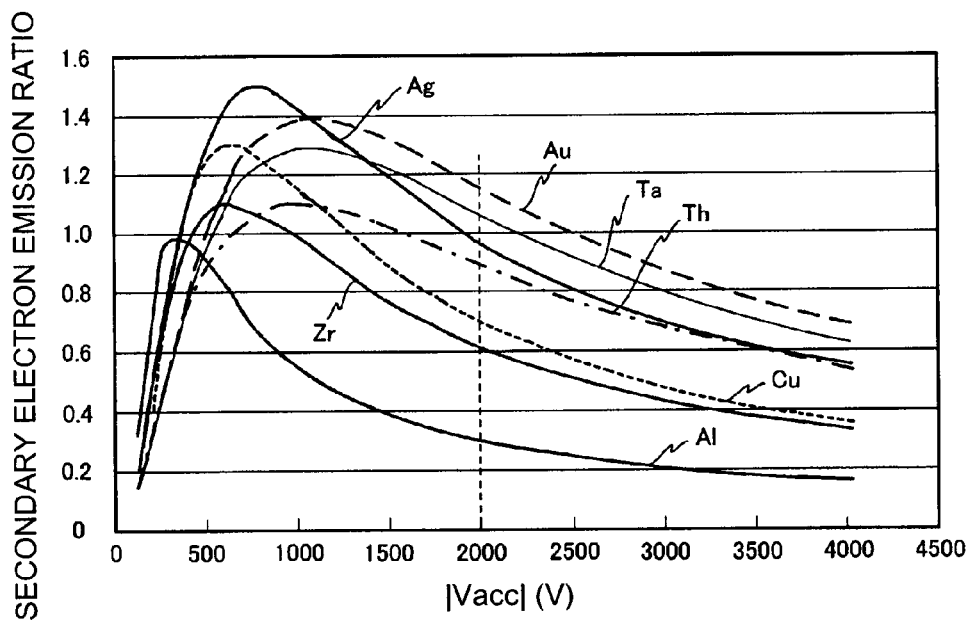
FIG. 13 is a graph for explaining a relation between a secondary electron-emission ratio and an acceleration voltage of each substance.

In this case, the surface of the emission-particle generation member 93a on which the charged particle (the primary repulsive electron, in this example) collides preferably has a flat and polished surface having high smoothness. When the emission-particle generation member 93a has an uneven surface, the quantity of the secondary electron generated from this surface varies, and this affects the contrast images. When the surface is ground to increase the surface precision, the quantity of the secondary electron becomes uniform, and this can decrease image noise. Preferably, surface coarseness Ra, as the surface precision, is equal to or smaller than 0.8 micrometer. To increase the smoothness of the surface, it is preferable to grind the surface to finish into a mirror surface. In this case, copper or aluminum is a preferable material. While copper and aluminum are appropriate to increase smoothness of the surface by grinding the surface, these materials have poor emission quantity of secondary electron. The secondary electron-emission ratio is preferably equal to or above 0.8, and is more preferably equal to or above one. FIG. 13 is a graph for explaining a relation between the energy of the incident electron and the secondary electron-emission ratio. When the acceleration voltage used at the measurement time is about 2 kilovolts, it is preferable to carry out surface treatment (coating) using the material having the secondary electron-emission ratio equal to or larger than 0.8. However, when the secondary electron-emission ratio is too high and when the emitted electron reaches the emission-particle generation member 93a again, the secondary electron emission quantity is amplified. Therefore, the secondary electron-emission ratio is preferably equal to or smaller than 2. Gold plating is preferable. Silver plating is also preferable, although the secondary electron-emission ratio is smaller than that of the gold plating. With this arrangement, both the signal according to the primary repulsive electron directly reaching the detector 91 and the signal according to the secondary electron generated based on the collision of the primary repulsive electron once against the emission-particle generation member 93a can be obtained, thereby obtaining a high-quality image.

In this case, it is necessary to pay attention to the backside (the surface opposite to the surface against which the primary repulsive electron collides) of the emission-particle generation member 93a which the primary repulsive electron does not reach. When the material of the emission-particle generation member 93a is aluminum, an insulation film is formed by oxidation, and there is a possibility that charges are accumulated in the emission-particle generation member 93a. In this case, the trajectory of the incident electron is influenced, and there is a risk that not only the image is distorted but also electric discharging occurs. Therefore, preferably, the back surface is also surface-treated to form a conductive film. For the surface treatment, electroless nickel plating which has excellent corrosion resistance is preferably performed. With this arrangement, charge accumulation in the emission-particle generation member 93a can be prevented, and image distortion and generation of electric discharging due to the bending of the trajectory of the incident electron can be suppressed. As a result, a satisfactory state can be always maintained.

Figure 14:
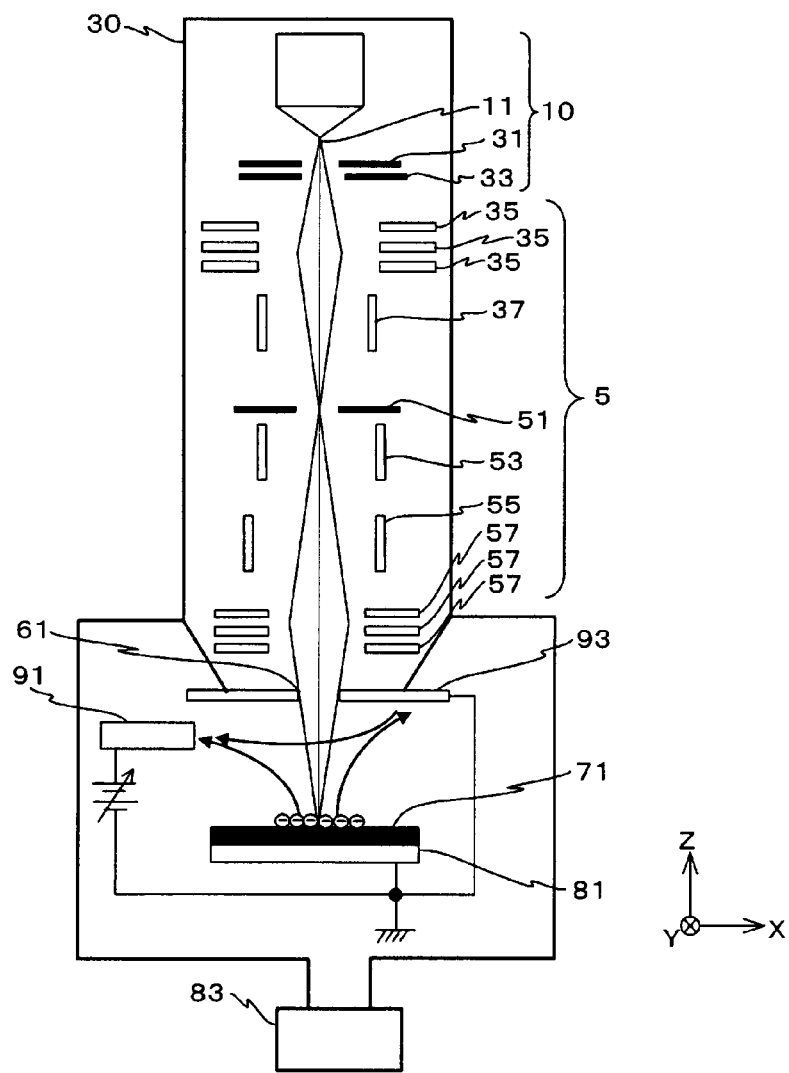
FIG. 14 is a schematic diagram for explaining a surface-potential distribution measuring apparatus having a beam-emission opening and an electron-emission panel opening in common.

In this case, preferably, the emission-particle generation member 93a is grounded, as shown in FIGS. 10 and 11. As shown in FIG. 14, the beam-emission opening 61 and the opening of the electron-emission panel 93 can be common. An exclusive conductive member capable of easily generating an electron can be also disposed. The emission-particle generation member 93a can be inclined to the detector 91 to facilitate the emission electron (the secondary electron) to reach the detector 91.

When the electron-emission panel 93 is disposed opposite to the sample 71 to cover a visual angle of 30 degrees or more relative to the optical axis of the electron beam optical system between the electron beam optical system 5 and the sample 71, many primary repulsive electrons collide against the electron-emission panel 93. Therefore, sensitivity of the whole measurement region can be held constant. Because the visual angle is symmetrical to the optical axis of the electron beam optical system 5, the image quality can be improved.

Figure 15:
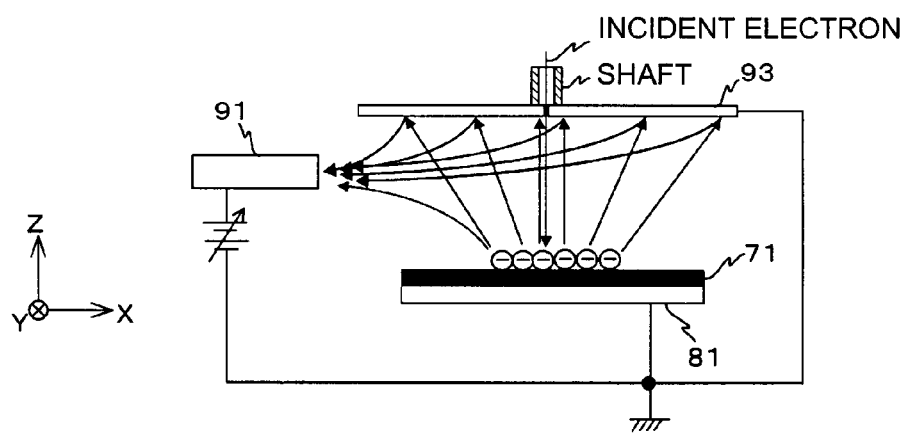
FIGS. 15 to 17 are schematic diagrams for explaining second to fourth modifications of the electron-emission panel shown in FIG. 1.

As shown in FIG. 15, the electron-emission panel 93 can have a shaft of a magnetic substance. With this arrangement, the bending of the incident electron can be suppressed by suppressing the influence of the external magnetic field. Because the electron-emission panel 93 is disposed near to the sample 71, the visual angle can be increased using the same area.

Figure 16:
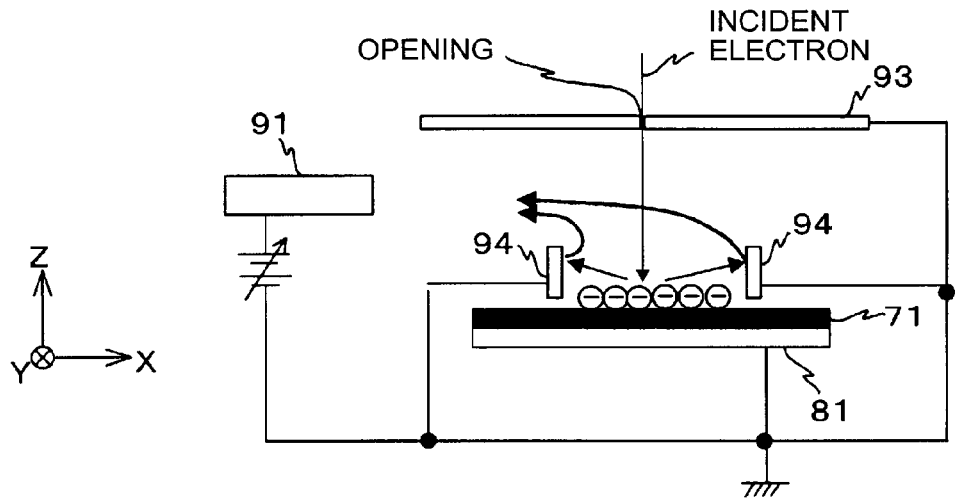

As shown in FIG. 16, an electron-emission panel 94 equivalent to the electron-emission panel 93 can be additionally provided near the sample 71 so that the primary repulsive electron repulsed at a large angle collides against the electron-emission panel 94. With this arrangement, the primary repulsive electron repulsed substantially in the lateral direction can be detected, and an extremely large range can be measured.

Figure 17:
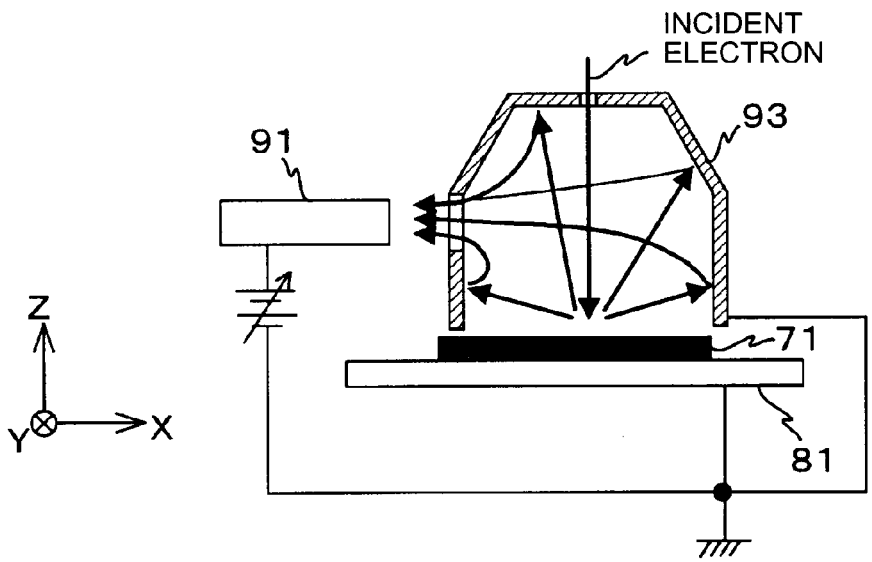

As shown in FIG. 17, by covering substantially the whole area of the sample 71, an opening can be provided at only a position where the incident electron reaches the electron-passing area and the detector 91. With this arrangement, substantially the whole primary repulsive electron can be detected by converting this electron into the secondary electron, thereby further improving the signal-to-noise (S/N) ratio.

Figure 18:
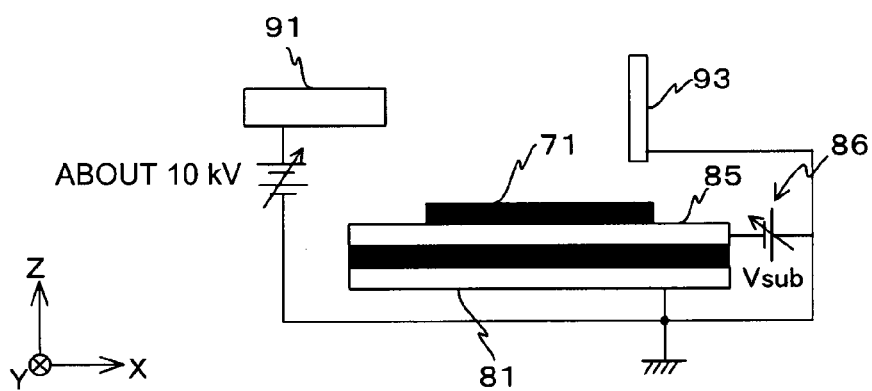
FIG. 18 is a schematic diagram for explaining a bias voltage applied to a sample.

While the acceleration voltage Vacc is changed in the first embodiment; however, for example, a bias voltage Vsub can be changed, with the acceleration voltage Vacc set constant, so that the bias voltage Vsub is applied to the sample 71. Specifically, as shown in FIG. 18, an electrode 85 can be formed on the sample table 81, and a power source 86 for applying Vsub to the electrode 85 can be further provided. With this arrangement, when Vacc=−1,800 V and Vsub=−1,250 V, a contrast image substantially the same as that when Vacc=−650 V in the first embodiment can be obtained. When Vacc=−1,800 V and Vsub=−1,100 V, a contrast image substantially the same as that when Vacc=−700 V in the first embodiment can be obtained.

While a sample formed with a thin image is set to the surface-potential distribution measuring apparatus in the first embodiment, the latent image can be formed on the sample within the surface-potential distribution measuring apparatus. In this case, the surface-potential distribution measuring apparatus has a function of forming the latent image. With this arrangement, the surface potential distribution can be measured in real time.

Figure 19:
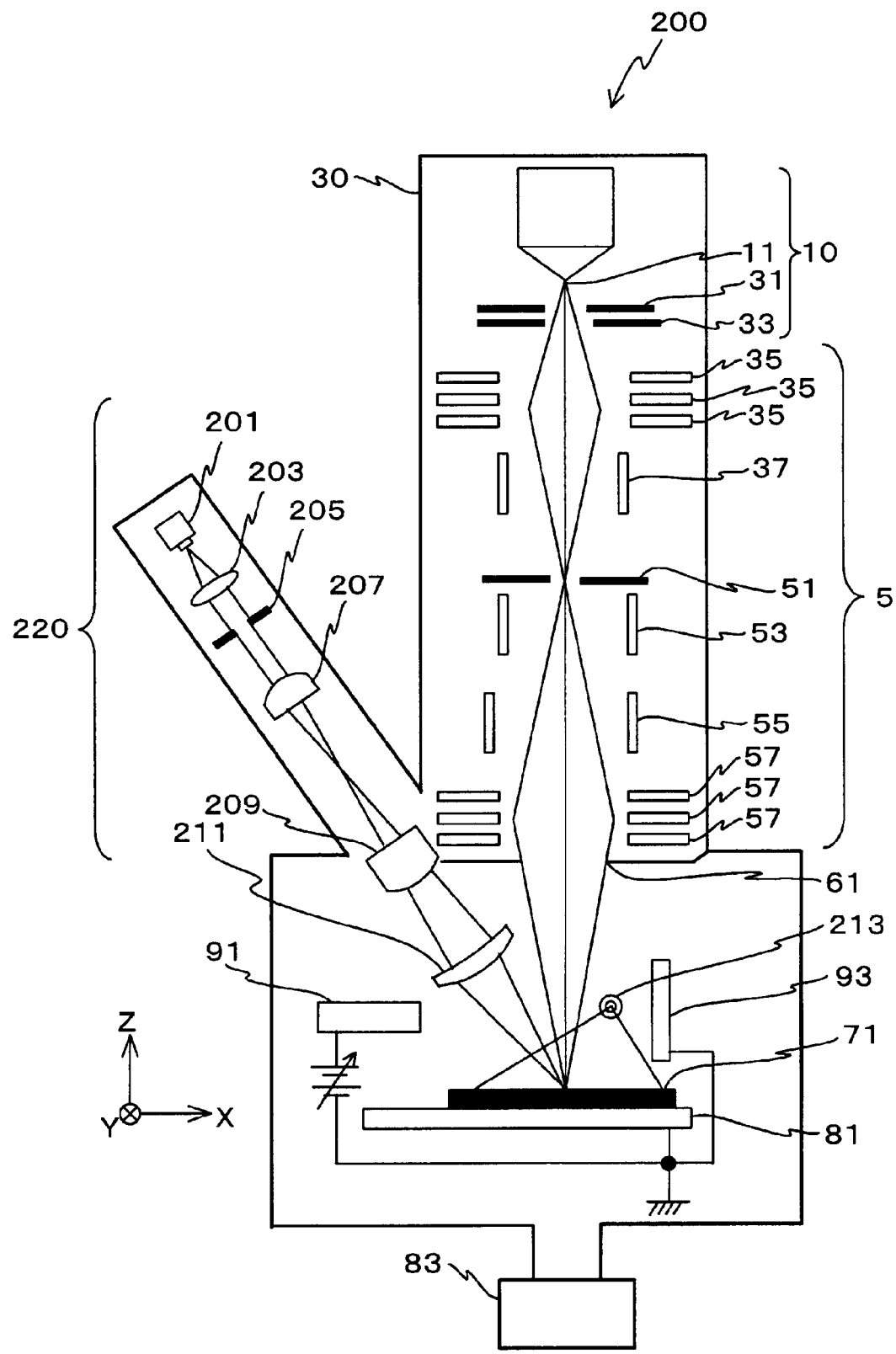
FIG. 19 is a schematic diagram of a first modification of the surface-potential distribution measuring apparatus shown in FIG. 1.

FIG. 19 is a schematic diagram of a surface-potential distribution measuring apparatus 200 having the function of forming a latent image as a first modification of the surface-potential distribution measuring apparatus 100. The surface-potential distribution measuring apparatus 200 includes a pattern forming device 220 that forms a pattern of a latent image by emitting light to the surface of the sample 71 differently from the surface-potential distribution measuring apparatus 100. A control system is not shown in FIG. 19.

The pattern forming device 220 includes a semiconductor laser 201 as a light source that emits light of a wavelength having sensitivity concerning the sample 71, a collimate lens 203, an aperture 205, and an imaging lens having three lenses (207, 209, 211). A light emitting diode (LED) 213 to neutralize the surface of the sample is disposed near the sample 71. The control system (not shown) controls the pattern forming device 220 and the LED 213. The optical system of the pattern forming device 220 is adjusted to form a desired beam diameter and a desired beam profile.

A method of forming a latent image by the surface-potential distribution measuring apparatus 200 is briefly explained as follows:

(1) The LED 213 is turned on, and the surface of the sample 71 is neutralized.

Figure 20:
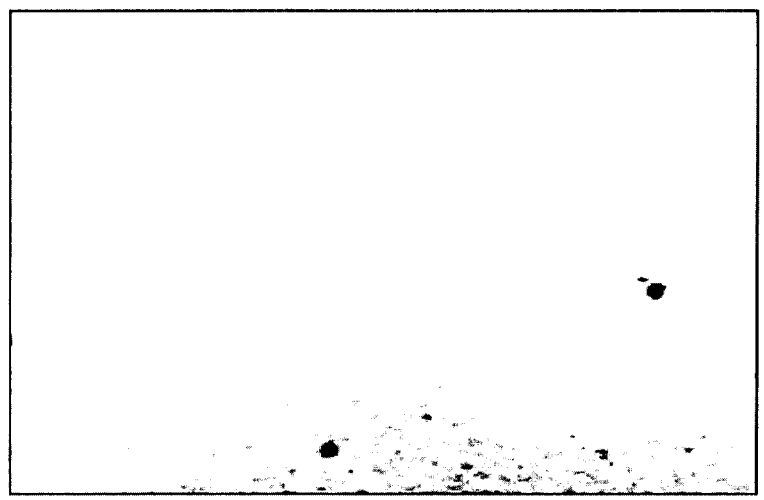
FIG. 20 is one example of a contrast image of a charged sample.

(2) The surface of the sample 71 is uniformly charged, using an electron beam emitted from the electron gun 10. When the acceleration voltage is set higher than the voltage at which the secondary electron-emission ratio becomes 1, the incident electron quantity becomes larger than the emission secondary electron quantity. Therefore, electrons are accumulated in the sample 1, and generate a charge-up. As a result, the sample 71 is negatively charged. The sample 71 can be charged in a desired potential, by controlling the acceleration voltage and the emission time. FIG. 20 is an example of a contrast image when the surface potential distribution is measured in a state that the surface of the sample 71 is charged. A contact charging, an injection charging, and ion emission charging can be also used to charge the sample 71.

(3) The semiconductor laser 201 emits light. A laser beam from the semiconductor laser 201 becomes approximately parallel beams through the collimate lens 203. The parallel beams are set to have a predetermined beam diameter through the aperture 205, and are focused on the sample surface with the focusing lens. Accordingly, a latent image is formed on the sample surface.

Therefore, the surface-potential distribution measuring apparatus 200 includes the electron gun 10, the electron beam optical system 5, the pattern forming device 220, and the LED 213 that constitute a latent image forming unit.

A scanning mechanism using a galvano mirror or a polygon mirror can be added to the optical system of the pattern forming device 220. By providing the scanning mechanism, an optional latent image pattern including a light pattern can be formed.

The photoconductor is required to have insulation resistance. Whether the sample 71 has electrostatic discharge damage can be evaluated with the surface-potential distribution measuring apparatus 200. When the sample 71 has electrostatic discharge damage, a position of the occurrence of this problem can be specified. That is, the insulation resistance of the sample 71 can be evaluated.

Figure 21:
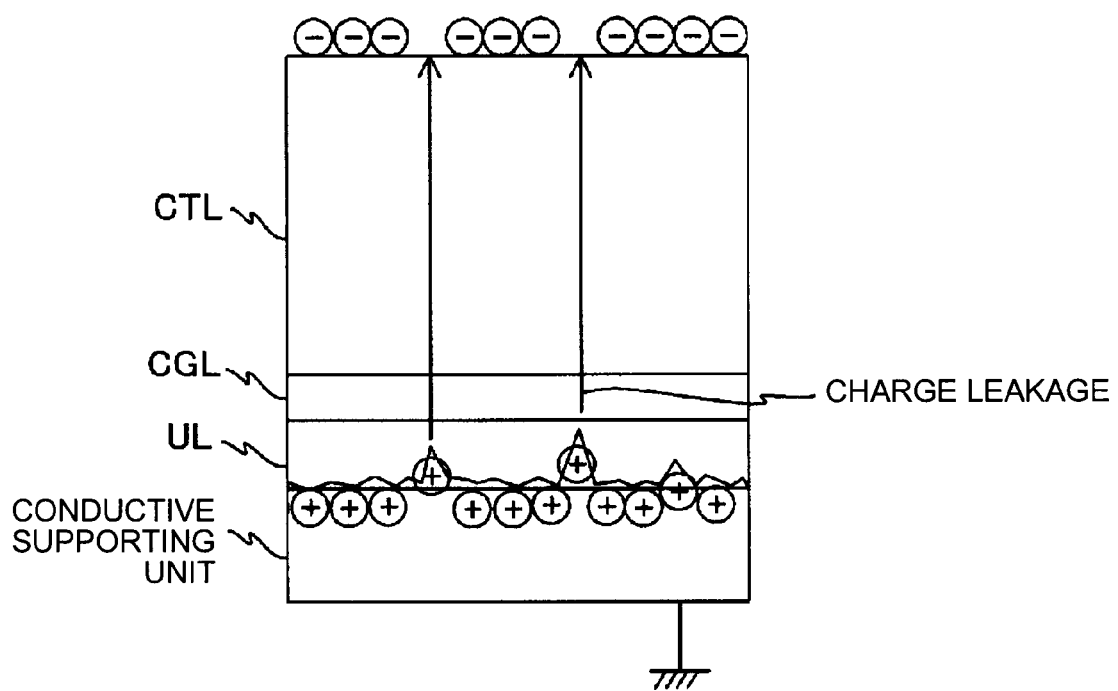
FIG. 21 is a schematic diagram for explaining charge leakage.

When the UL cannot bear the electric field strength in the thickness direction of the photoconductor, charge leakage occurs at the weakest point, and a hole (electron hole) reaches the surface. The charge is then offset by the negative charge on the surface of the photoconductor, and a charge distribution is generated on the surface (see FIG. 21). When the charged photoconductor is scanned with an electron beam to detect the primary repulsive electron and the secondary electron, it is possible to specify whether the electrostatic discharge damaging occurs. When the electrostatic discharge damaging occurs, a position of the occurrence of charge leakage can be specified in the micro order.

A minimum size of the toner is about 5 micrometers. When charge leakage having a toner size equal to or larger than 5 micrometers does not occur, it can be assumed that there is no charge leakage. When electric field strength applied to the thickness direction of the photoconductor used in the image forming apparatus is equal to or smaller than 10 V/μm, absence of the occurrence of charge leakage of a toner size equal to or larger than 5 micrometers is at least necessary.

To avoid the occurrence of noise in the output image, presence of 99% or more of the insulation resistance region is necessary when the electric field strength in the thickness direction of the photoconductor is equal to or higher than 30 V/μm and equal to or lower than 40 V/μm and also when charge is irradiated by about $1 \times 10^{-8}$ C/mm$^2$.

Figure 22:
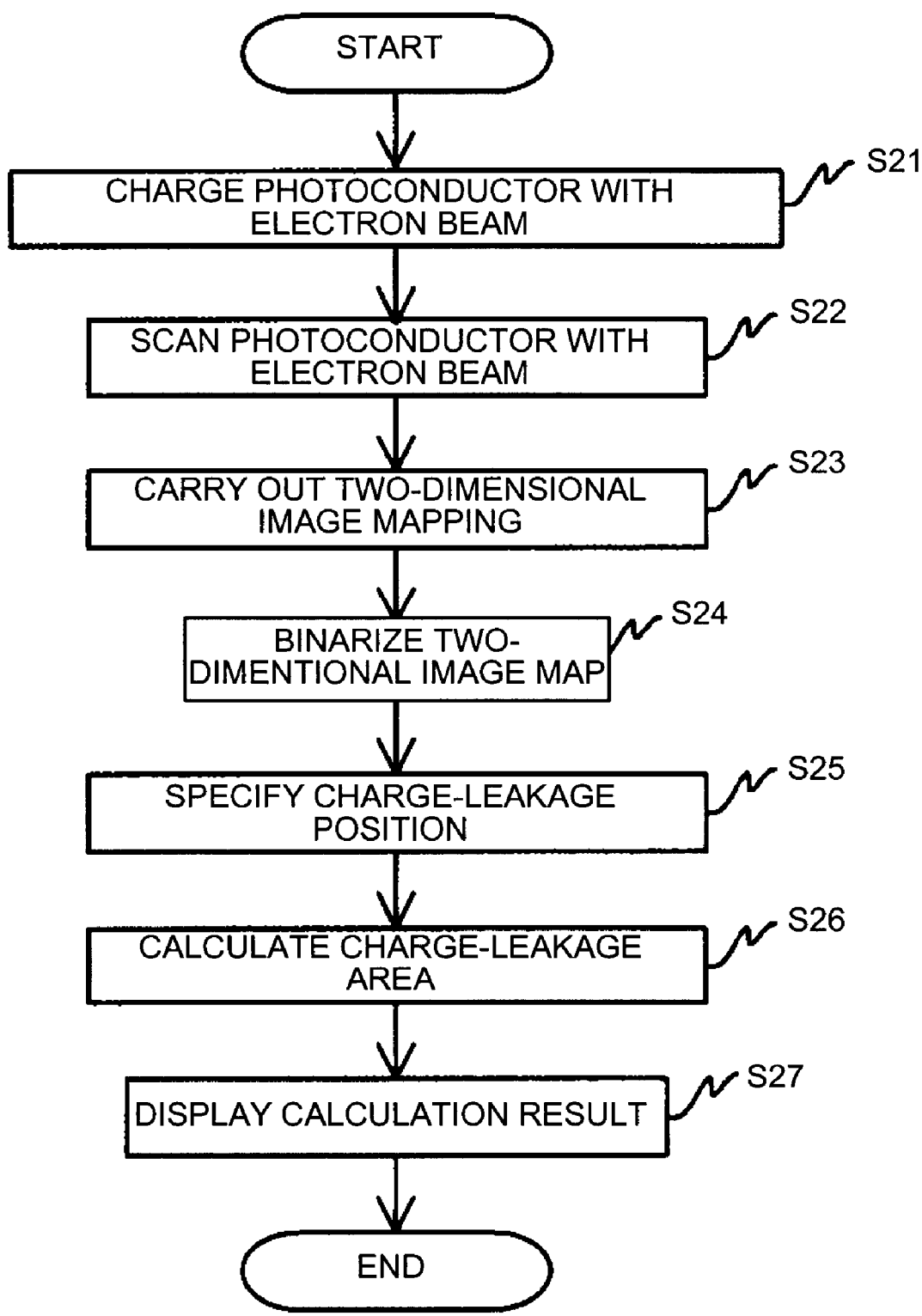
FIG. 22 is a flowchart of a process of evaluating withstand voltage performance.

A method of evaluating the insulation resistance performance of the photoconductor with the surface-potential distribution measuring apparatus 200 is explained below. FIG. 22 is a flowchart of a process performed by the computer of the control system 3. Upon receiving an instruction to evaluate the insulation resistance performance of the photoconductor from the operator, the computer of the control system 3 sets the header address of a computer program corresponding to the flowchart of FIG. 22 to a program counter.

An electron beam is emitted to the photoconductor to charge the photoconductor (step S21). The photoconductor is charged in the condition that the irradiation current is $1 \times 10^{-9}$ amperes, the irradiation area is 1.47 mm$^2$, and the irradiation time is four minutes. That is, a total charge quantity is $1.6 \times 10^{-7}$ C/mm$^2$.

The surface of the photoconductor is scanned with an electron beam (step S22). A signal output from the detector 91 during the scanning is stored in an operation memory (not shown). When the scanning ends, a two-dimensional image mapping is performed based on the output signal of the detector 91 stored in the operation memory (step S23).

The two-dimensional image map is binarized (step S24). A charge-leakage position is specified (step S25). A charge-leakage area is calculated (step S26). A calculation result is displayed on the display device (step S27). Thus, the evaluation process of the insulation resistance performance ends.

Figure 23:
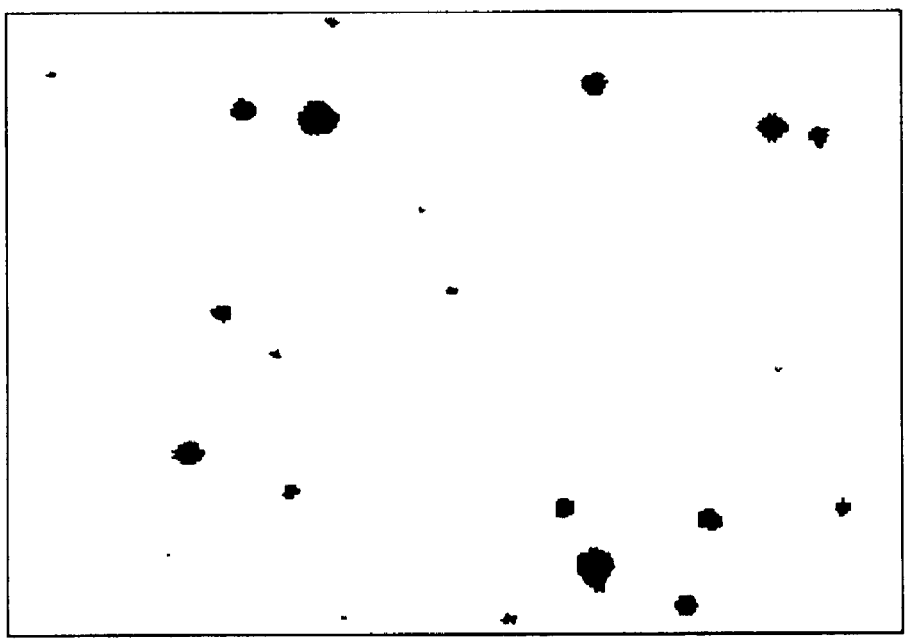
FIGS. 23 and 24 are schematic diagrams for explaining a contrast image obtained in the evaluation of withstand voltage performance.

Insulation resistance is high when the area rate of the region where the charge leakage occurs is small. In the case of the two-dimensional image map shown in FIG. 23, the photoconductor can be evaluated that the charge-leakage area rate is 1.2%, i.e., the insulation-resistance region is 8.8% and noise occurs easily.

Figure 24:
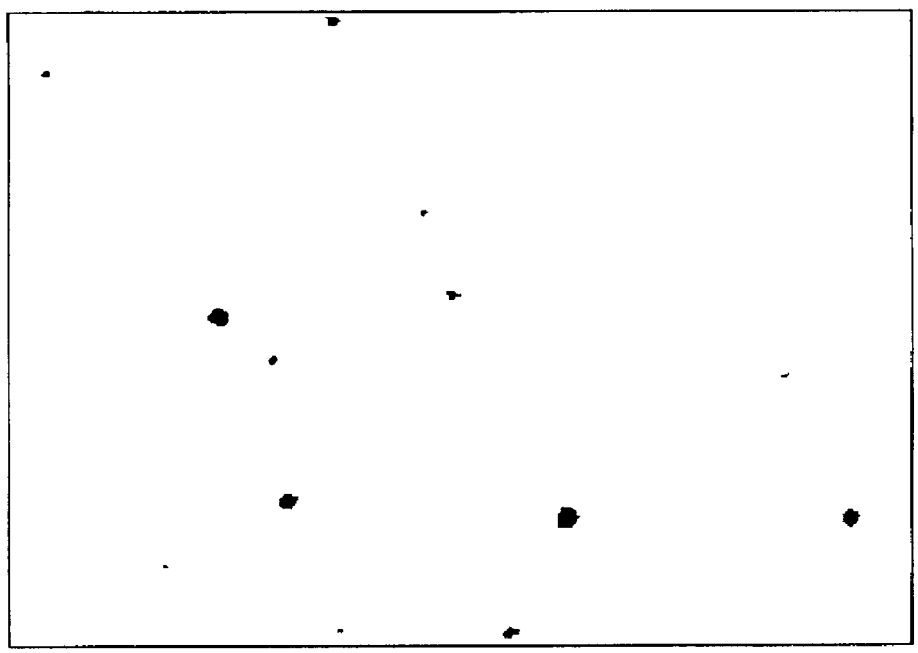

On the other hand, in the case of the two-dimensional image map shown in FIG. 24, the photoconductor can be evaluated that the charge-leakage area rate is 0.4%, i.e., the insulation-resistance region is 99.6% and photoconductor is excellent in insulation performance.

As explained above, by evaluating the occurrence of charge leakage, the evaluation can be fed back to design, thereby improving the quality of each process. Therefore, a photoconductor having high image quality, high durability, high stability, and excellent energy saving can be provided. By measuring a position of charge leakage, the occurrence of noise in the photoconductor and its cause that cannot be easily analyzed in the past can be analyzed. By specifying the charge-leakage position and by evaluating the quality, a photoconductor with excellent durability and high image quality can be provided.

Figure 25:
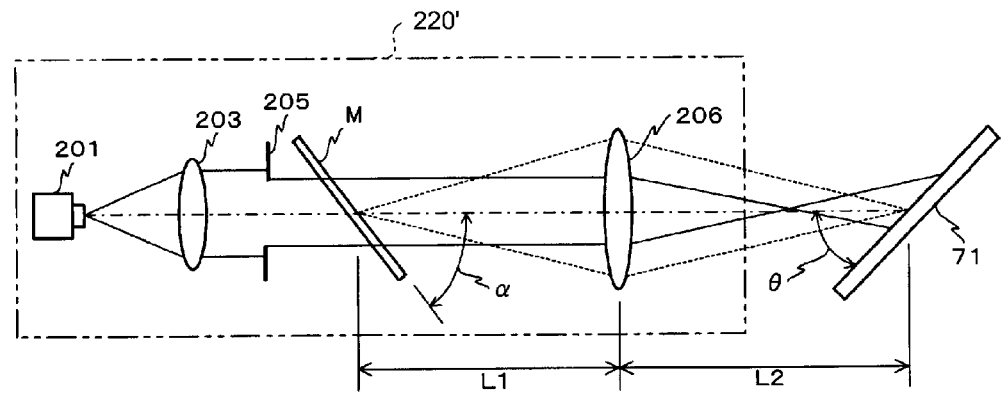
FIG. 25 is a schematic diagram for explaining an optical system of a pattern forming device suitable for evaluating resolution of a photoconductor.

FIG. 25 depicts a pattern forming device 220' which is a modification of the pattern forming device 220 of the surface-potential distribution measuring apparatus 200. This pattern forming device 220' can also evaluate resolution of the photoconductor, and includes the semiconductor laser 201, the collimate lens 203, the aperture 205, and an imaging lens 206. A mask M is set on a path between the aperture 205 and the imaging lens 206. When an object distance of the mask M in the imaging lens 206 is L1 and when an image distance is L2, an imaging magnification in a direction perpendicular to the optical axis of the imaging lens 206 is L2/L1, and an image of a pattern (hereinafter, also "mask pattern") of the mask M corresponding to this magnification is formed on the surface of the sample 71. That is, when L1=L2, the magnification is equal. When the inclination angle of the surface of the sample 71 relative to the optical axis of the imaging lens 206 is θ and also when the inclination angle of the mask M relative to the optical axis of the imaging lens 206 is α, a relation of L1×tan α=L2×tan θ is established.

Figure 26:
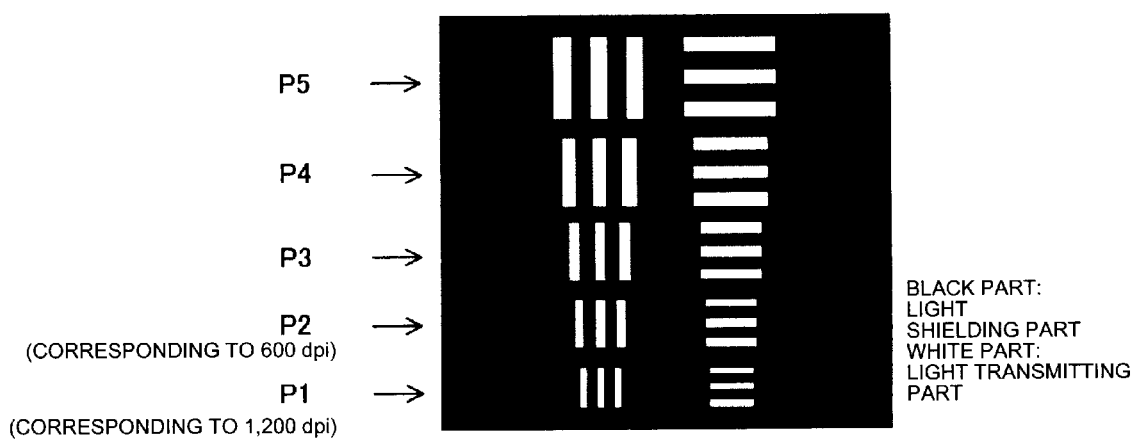
FIG. 26 is a schematic diagram of a mask pattern used to evaluate resolution of a photoconductor.

As shown in FIG. 26, the mask pattern includes five sets of pairs of basic patterns (P1, P2, P3, P4, P5), each set having three equal rectangles arrayed in equal pitches, with the longitudinal directions of the rectangles set in a crossed direction. In FIG. 26, a white part is a light transmitting part, and a black part is a light shielding part.

Figure 27A:
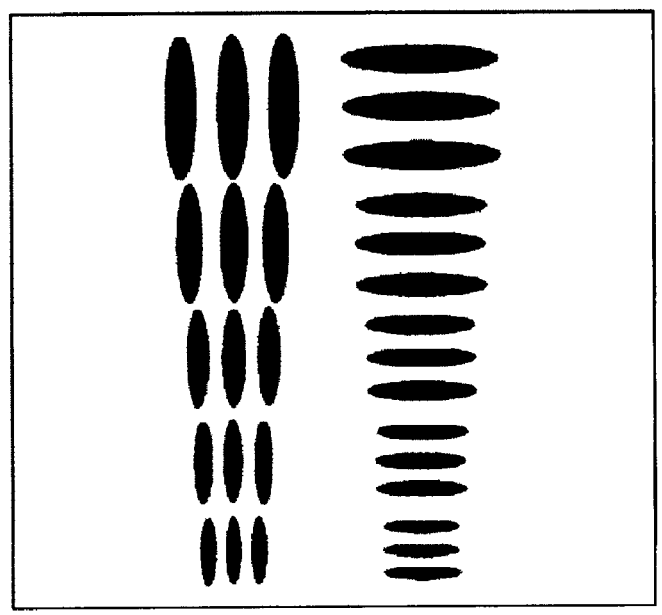
FIGS. 27A and 27B are schematic diagrams of a contrast image obtained from a photoconductor onto which the mask pattern shown in FIG. 26 is transferred.
Figure 27B:
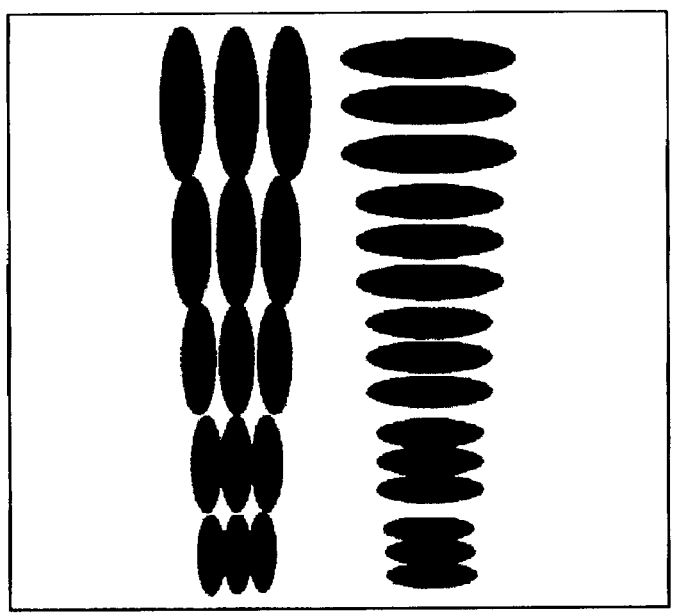

Two kinds of photoconductors (photoconductor A, and photoconductor B) charged in the same condition are used as samples, and the mask patterns are transferred to each photoconductor in the same condition, thereby obtaining each potential contrast image. FIG. 27A is an example of a potential contrast image obtained from the photoconductor A (hereinafter, "contrast image A"), and FIG. 27B is an example of a potential contrast image obtained from the photoconductor B (hereinafter, "contrast image B"). In the contrast image B, the rectangular parts of the two pairs of basic patterns P1 and P2 are connected to each other, and are not separated. Therefore, the resolution of the photoconductor B is the level of the pair of basic patterns P3. On the other hand, in the contrast image A, the rectangular parts of the transfer image of the pair of basic patterns P1 having the smallest pattern pitches are separated. Therefore, the resolution of the photoconductor A is equal to or higher than the level of the pairs of the basic patterns P1.

As described above, resolution of a photoconductor can be identified and evaluated from the potential contrast image obtained by transferring plural pairs of basic patterns having mutually different pitches to the photoconductor. Further, characteristics of an electrostatic latent image formed on the photoconductor can be evaluated, by properly selecting a size, a pitch, and a shape of a mask pattern.

For example, when the image forming apparatus has writing density of 600 dots per inch (dpi), the photoconductor needs to have the resolution of 42.3 micrometers (25.4 mm/600), and when the image forming apparatus has writing density of 1,200 dpi, the photoconductor needs to have the resolution of 21.2 micrometers. Therefore, when a pattern pitch of two times 42.3 micrometers is transferred in a white and black pair, and when the pattern pitch can be identified in the obtained potential contrast image, this can be determined as the resolution of the photoconductor. When a width of P1 on the photoconductor is 21.2 micrometers, and when a width of P2 on the photoconductor is 42.3 micrometers in FIG. 26, it is clear that the photoconductor A has resolution corresponding to the image forming apparatus of 1,200 dpi; however, the photoconductor B does not have resolution corresponding to the image forming apparatus of 600 dpi. As explained above, a photoconductor onto which a high-density writing is possible can be obtained, by understanding the resolution and by feeding back the resolution to design.

Figure 28:
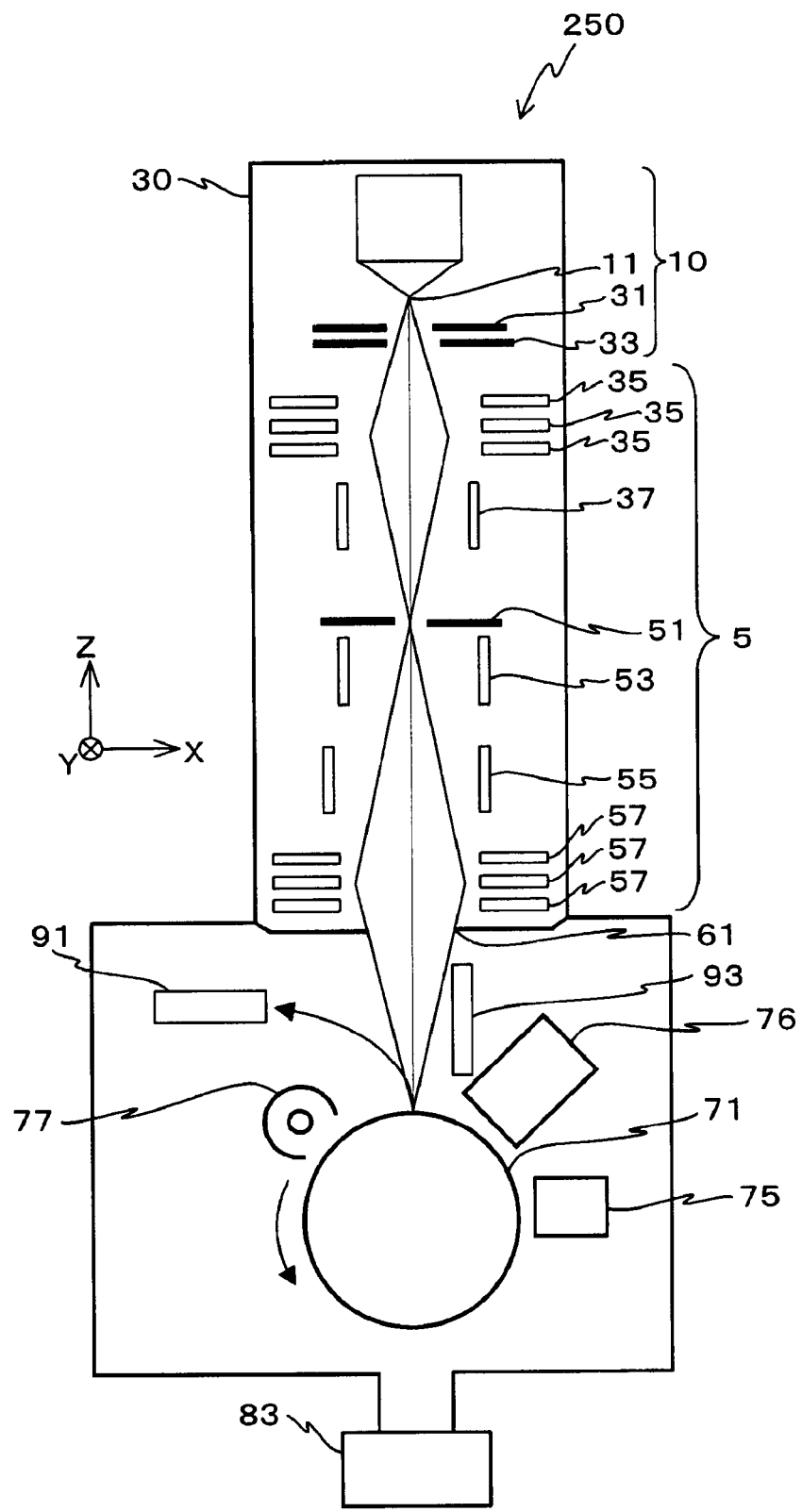
FIG. 28 is a schematic diagram of a second modification of the surface-potential distribution measuring apparatus shown in FIG. 1.

While the sample has a panel shape in the first embodiment, the sample can also have a cylindrical shape. FIG. 28 is a schematic diagram of a surface-potential distribution measuring apparatus 250 as a second modification of the surface-potential distribution measuring apparatus 100. The surface-potential distribution measuring apparatus 250 can include a latent image forming apparatus. The surface-potential distribution measuring apparatus 250 has the latent image forming apparatus added to the surface-potential distribution measuring apparatus 100. This latent image forming apparatus includes a charging unit 75, an exposing unit 76, and a neutralizing unit 77. The charging unit 75 charges the surface of the sample 71, and the exposing unit 76 forms a latent image. After a surface potential distribution is measured, the neutralizing unit 77 neutralizes the surface of the sample 71. When the sample is a photosensitive drum that is used in electrophotographic image forming apparatuses such as a laser printer and a digital copier, a feedback of the result of measuring the surface potential distribution to the design of the image forming apparatus improves the process quality at each step of the image formation, thereby achieving high image quality, high durability, high stability, and energy saving. A control system is not shown in FIG. 28.

Figure 29:
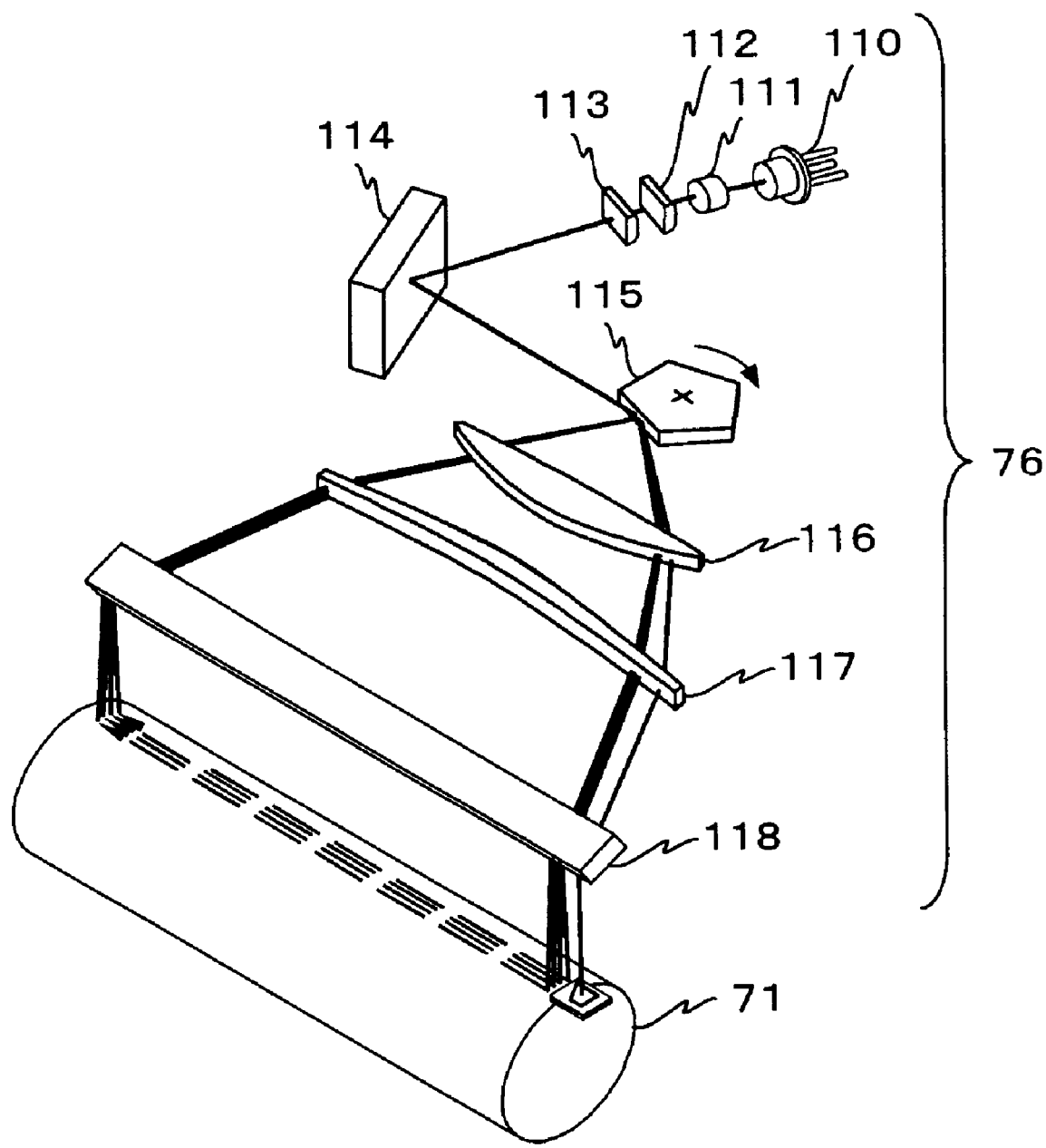
FIG. 29 is a schematic diagram of an exposing unit shown in FIG. 28.

As shown in FIG. 29, the exposing unit 76 can include a semiconductor laser 110, a collimate lens 111, an aperture 112, a cylinder lens 113, two fold mirrors (114, 118), a polygon mirror 115, and two scanning lenses (116, 117).

The semiconductor laser 110 emits a laser beam for exposure. The collimate lens 111 sets the laser beam emitted from the semiconductor laser 110 to approximately parallel beams. The aperture 112 prescribes the beam diameter of the light from the collimate lens 111. The aperture 112 can set an optional beam diameter within a range of 20 micrometers to 200 micrometers, by changing the size of the aperture 112. The cylinder lens 113 shapes the light passing through the aperture 112. The fold mirror 114 folds the optical path of the light from the cylinder lens 113 to a direction of the polygon mirror 115. The polygon mirror 115 has plural deflection surfaces, and deflects the light from the fold mirror 114 at a conformal speed within a predetermined angle range.

The operation of the exposing unit 76 is briefly explained. The light emitted from the semiconductor laser 110 is once focused to form an image near the deflection surface of the polygon mirror 115, via the collimate lens 111, the aperture 112, the cylinder lens 113, and the fold mirror 114. The polygon mirror 115 rotates to an arrowhead direction in FIG. 29 at a constant speed with a polygon motor (not shown). The light forming an image near the deflection surface following this rotation is deflected at a conformal speed. The deflected light scans the surface of the sample 71 via the two scanning lenses (116, 117) and the fold mirror 118. That is, an optical spot moves to a longitudinal direction of the sample 71.

While the electron beam is used as a charged particle beam in the first embodiment, an ion beam can be also used for the charged particle beam, instead of the electron beam. In this case, an ion gun is used in place of the electron gun. When a gallium (Ga) liquid metal ion gun is used as the ion gun, the acceleration voltage becomes a positive voltage, and a bias voltage is added to the sample 71 so that the surface potential becomes positive.

While the surface potential of the sample is explained as negative in the first embodiment, the surface potential of the sample can be also positive. That is, the surface can have a positive charge. In this case, a positive ion beam such as a gallium beam can be emitted to the sample.

While the surface potential is obtained based on the primary repulsive electron in the first embodiment, the surface potential distribution can be obtained based on the secondary electron emitted from the sample, when there is no risk of the influence of the material or the surface shape of the sample. In this case, the detector 91 detects both the secondary electron from the sample, and the secondary electron emitted from the electron-emission panel 93 after the secondary electron from the sample collides against the electron-emission panel 93.

Figure 30A:
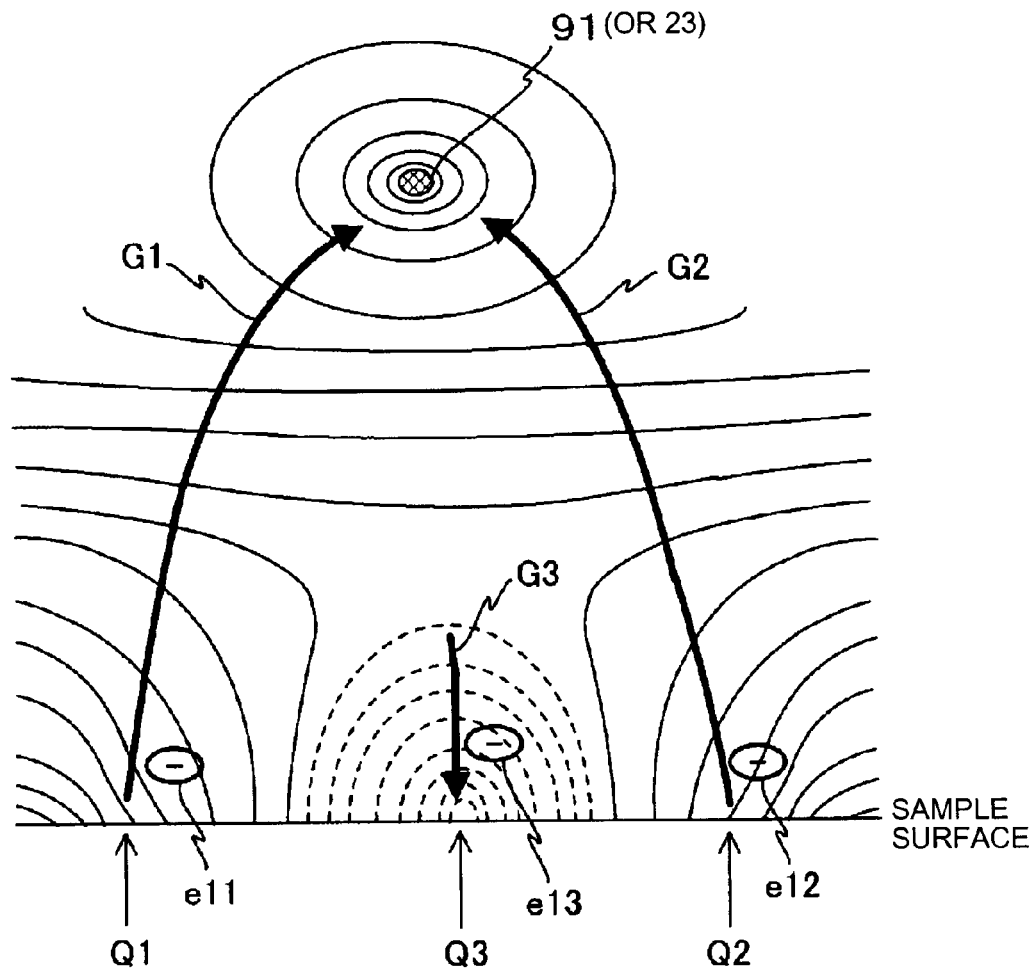
FIGS. 30A and 30B are schematic diagrams for explaining measurement of a surface potential distribution using a secondary electron.

When there is a charge distribution on the surface of the sample, an electric field distribution corresponding to the surface charge distribution is formed in space. Therefore, the secondary electron generated by the incident electron is pushed back by this electric field, and the quantity of the secondary electron reaching the detector decreases. Accordingly, an exposed part of the charge leakage position turns black and a non-exposed part turns white, thereby making it possible to obtain a contrast image according to the surface charge distribution. FIG. 30A represents in contour lines the potential distribution in the space between the detector 91 and the sample. The surface of the sample is uniformly charged in the negative polarity, except a part where the potential is attenuated due to the optical attenuation. Because the positive potential is given to the detector 91, the potential becomes higher toward the detector 91 from the surface of the sample, in the potential contour lines indicated by solid lines. Therefore, secondary electrons e11 and e12 generated at points Q1 and Q2, respectively, as uniformly charged parts of the sample in the negative polarity in FIG. 30A, are drawn to the positive potential of the detector 91, and are displace as shown by arrowheads G1 and G2. The detector 91 captures these secondary electrons.

Figure 30B:
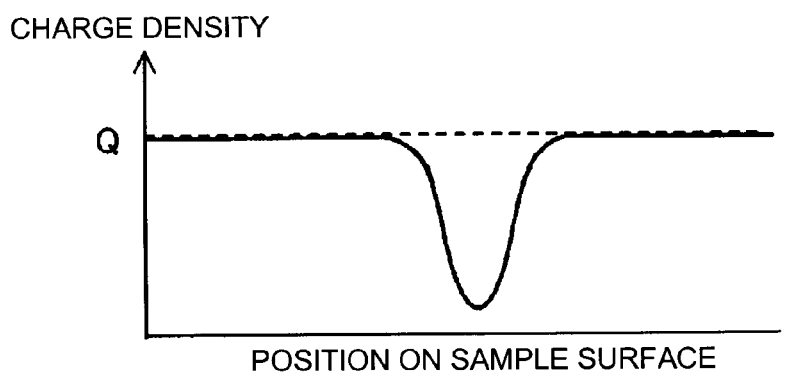

On the other hand, in FIG. 30A, a point Q3 is a part where the negative potential is attenuated by the optical emission. The array of the potential contour lines near the point Q3 is as shown by broken lines. In this partial potential distribution, the contour line near the point Q3 has a higher potential. That is, electric force stalled at the sample side works on a secondary electron e13 generated near the point Q3, as shown by an arrowhead G3. Therefore, the secondary electron e13 is captured by a hole of potential indicated by the potential contour lines of broken lines, and does not move to the detector 91. FIG. 30B schematically depicts the hole of the potential. That is, the intensity of the secondary electron (the number of the secondary electrons) detected by the detector 91 is such that the part having high intensity corresponds to the ground part of the electrostatic latent image (the part uniformly charged in negative, i.e., the parts represented by the points Q1 and Q2 in FIG. 30A), and the part having low intensity corresponds to the image part of the electrostatic latent image (the part emitted with light, i.e., the part represented by the point Q1 in FIG. 30A).

Therefore, when the output signal of the detector 91 is sampled at a suitable sample time, the surface potential distribution can be specified for each fine region corresponding to the sampling, using the sampling time as a parameter. For example, when the intensity of the captured secondary electron is expressed in the intensity of brightness, the image part of the electrostatic latent image becomes dark, and the ground part becomes bright with a contrast. Therefore, a contrast image corresponding to the surface charge distribution can be obtained (output). Further, a surface charge distribution can be obtained from the surface potential distribution.

While the detector 91 draws the secondary electron emitted from the electron-emission panel 93 in the first embodiment, the detector 91 can also draw ions emitted from the electron-emission panel 93. In this case, the detector 91 is given a negative drawing voltage.

A second embodiment of the present invention is explained next. The surface-potential measuring method and the surface-potential measuring method can measure, in potential resolution of a few volts, a few hundred to a few thousand surface potentials and charge, even in a small region of 1 millimeter or smaller of an electrostatic latent image on a photoconductor, which it has been difficult to achieve according to the conventional technique. The image carrier (photoconductor) has high performance, evaluated by the above method and the above device. The image forming apparatus includes this high-performance image carrier.

The surface charge explained herein is scattered in space within the sample, as is widely known. Therefore, it is assumed that the surface charge is distributed in a larger area in the in-plane direction than in the thickness direction. The electric charge includes not only electrons but also ions. A conductive part can be present on the surface, a voltage can be applied to the conductive part, and the sample surface or its vicinity can generate a potential distribution due to this voltage application.

Figure 31:
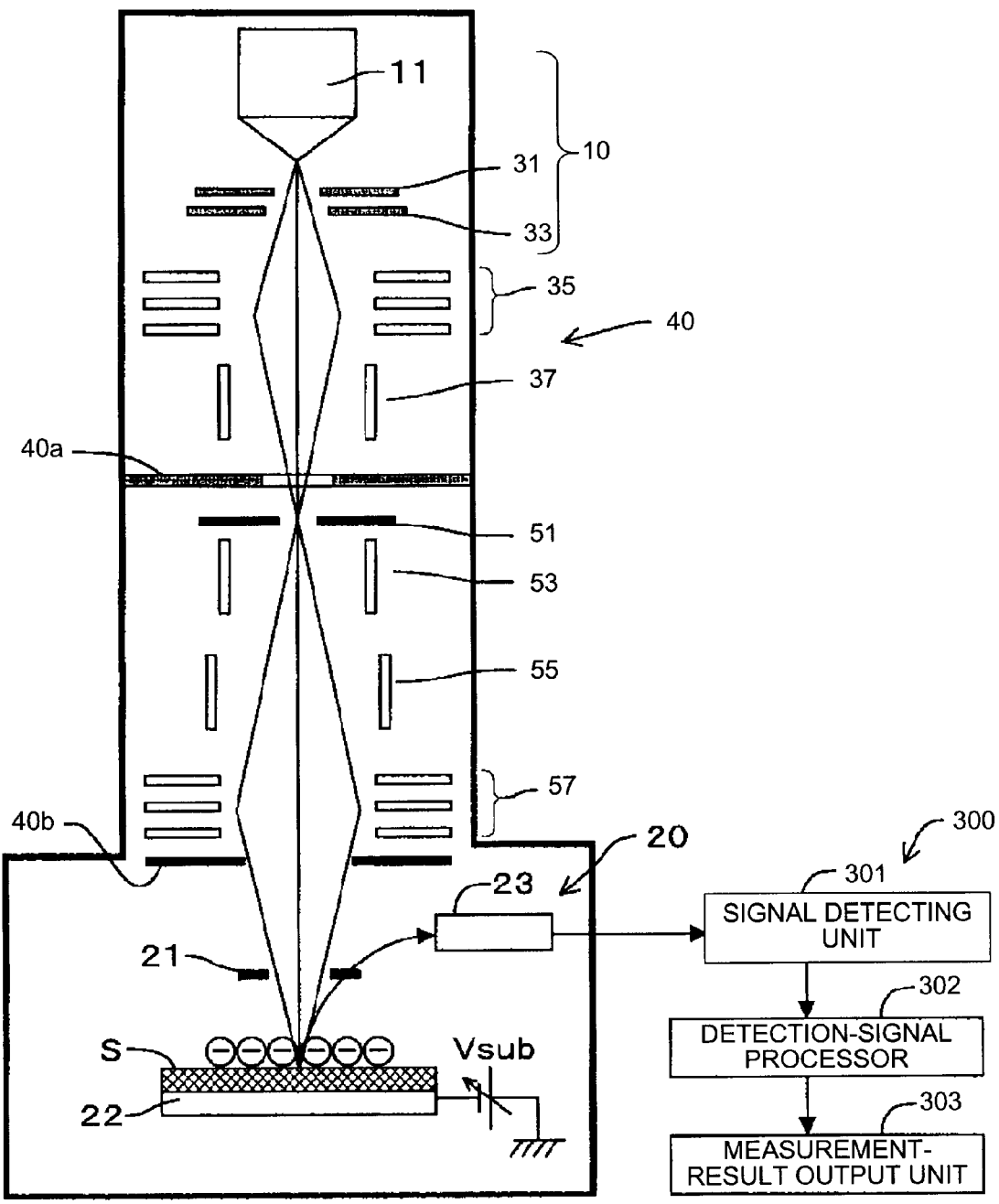
FIG. 31 is a schematic diagram of relevant parts of a surface-potential measuring apparatus according to a second embodiment of the present invention.

In the second embodiment, like reference numerals refer to portions corresponding to those in the first embodiment. While the charged particle means a particle that receives the influence of an electric field and a magnetic field of the electron beam or the ion beam, the electron beam is emitted in the following explanation of the second embodiment. FIG. 31 depicts relevant parts of the measuring apparatus of the surface potential. The measuring apparatus of the surface potential includes a charged-particle optical system 40 that emits an electron beam as the charged particle beam, a detecting unit 20, and a measuring control unit 300. The charged-particle optical system 40 and the detecting unit 20 are disposed within the same chamber, and the inside of the chamber is vacuum.

The charged-particle optical system 40 includes the electron gun 10 that generates the electron beam. The electron gun 10 includes the emitter 11, a suppressor electrode and the extraction electrode 31 that controls the electron beam, the acceleration electrode 33 that applies an acceleration voltage to control the energy of the electron beam, the condenser lens (electrostatic lens) 35 that focuses the electron beam generated from the electron gun, the beam-blanking electrode 37 that turns on/off the electron beam, the aperture (movable aperture) 51, the stigmator 53 that corrects an astigmatism, the scanning lens (deflection electrode) 55 that scans with the electron beam which passes the stigmator, and the electrostatic objective lens (electrostatic lens) 57 that focuses the light from the scanning lens 55 again. A partition valve (gate valve) 40a is disposed between the beam-blanking electrode 37 and the aperture 51, and a beam-emission opening 40b is disposed beneath the electrostatic objective lens 57. Each lens is connected with a driving power source (not shown). When the ion beam is used, a liquid metal ion gun or the like is used in place of the electron gun.

The detecting unit 20 includes a reversed-particle detecting member 21 described later, a sample table 22 on which the sample S is mounted, and a detector 23 that detects a primary reversed-charged particle, and a secondary electron. The detector 23 is a combination of a scintillator (phosphor) and a photomultiplier tube. Because the secondary electron generated from the sample S has low energy, the secondary electron is accelerated by the influence of the electric field of a high voltage applied to the surface of the scintillator, and is transformed into light. The photomultiplier tube (PMT) amplifies the light passing through a light pipe into a current. The amplified light is taken out as a current signal. An XY driving mechanism (not shown) can move the sample table 22 two-dimensionally in parallel with the surface of the sample S. Accordingly, a satisfactory image can be observed by scanning the sample S with the electron beam.

The reversed-particle detecting member 21 is a sensor that is disposed near the upper surface of the sample S, and detects an incident electron which proceeds to the sample S having this surface potential but is reversed without reaching the sample S (reversed particle, reversed electron). For this purpose, the reversed-particle detecting member 21 is set outside or near the scan electron region of the electron beam.

The measuring control unit 300 includes a computer or the like, and includes a signal detecting unit 301 connected to the detector 23, a detection-signal processor 302, and a measurement-result output unit 303. The signal detecting unit 301, the detection-signal processor 302, and the measurement-result output unit 303 include input and output interfaces of the computer, various functions such as the processing function obtained when a central processing unit (CPU) executes the computer program, and output devices such as a printer and a display.

Figure 32A:
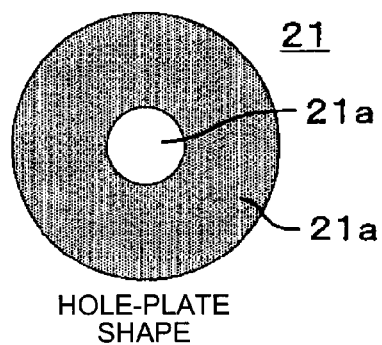
FIGS. 32A to 32D are examples of a reversed-particle detecting member shown in FIG. 31.

FIGS. 32A to 32D are examples of shapes of the reversed-particle detecting member 21. The reversed-particle detecting member 21 includes an opening 21a through which the incident electron passes, and shielding substance (conducting part) 21b that shield part of electrons reaching the detector 23. FIG. 32A depicts a hole-plate shape as one example.

Figure 32B:
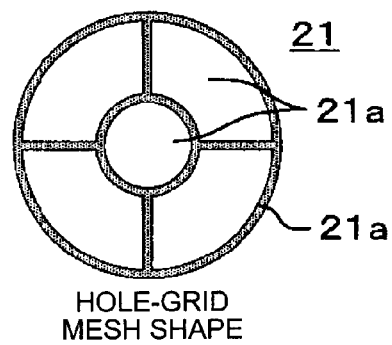
Figure 32C:
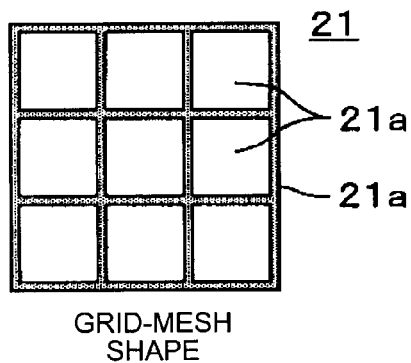
Figure 32D:
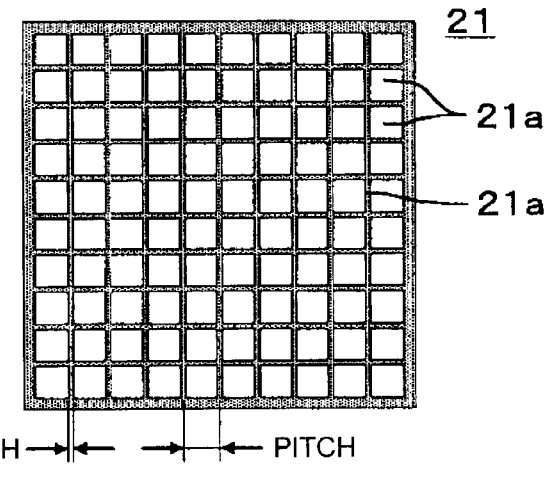

A mesh is an appropriate shape in that the area that shields the incident electron or a secondary electron and a reversed electron is small. The mesh shape can be a hole-grid mesh as shown in FIG. 32B, and a grid mesh having a lattice shape as shown in FIG. 32C. The number of meshes can be three or more as shown in FIG. 32D, and this shape is suitable to measure surface potentials at plural points of the sample S.

When the shielding area of the mesh shape is large, a shade of the secondary electron occurs easily, and when the width of the mesh is small, detection sensitivity at the time of the occurrence of the reflection electrode decreases. A satisfactory shielding area is 2 to 20%, and about 5% is preferable. For example, when the mesh pitch is 1 millimeter, a satisfactory line width of the shielding area is about 0.02 millimeter to 0.2 millimeter, and is preferably about 0.05 millimeter.

When a nonmagnetic material such as aluminum and phosphor bronze or a weak magnetic material such as a steel-use-stainless (SUS) is used for the material of the reversed-particle detecting member 21, the surface potential can be measured without affecting the trajectory of the incident charged particles. When a conductive material is used, the influence of a charged material in the electromagnetic field can be suppressed. Preferably, the material has a small electron-emission ratio.

When a gap (distance) between the reversed-particle detecting member 21 and the sample S is small, a shade is not easily generated, and therefore, the gap is preferably 0.1 millimeter or more. When the gap is too large, the detection sensitivity decreases. Therefore, the gap is preferably 5 millimeters or smaller.

When the reversed-particle detecting member 21 is set near slightly at the outside of the electron beam scanning area, this position is desirable because of not shielding the object to be measured (sample S). The reversed-particle detecting member 21 can be also set within the scanning area. The pitch and the shape of the grid can be suitably differentiated based on the measured object and the observation magnification. The reversed-particle detecting member 21 can be also applied with a voltage to control the energy and the trajectory of the incident electron.

Figure 33A:
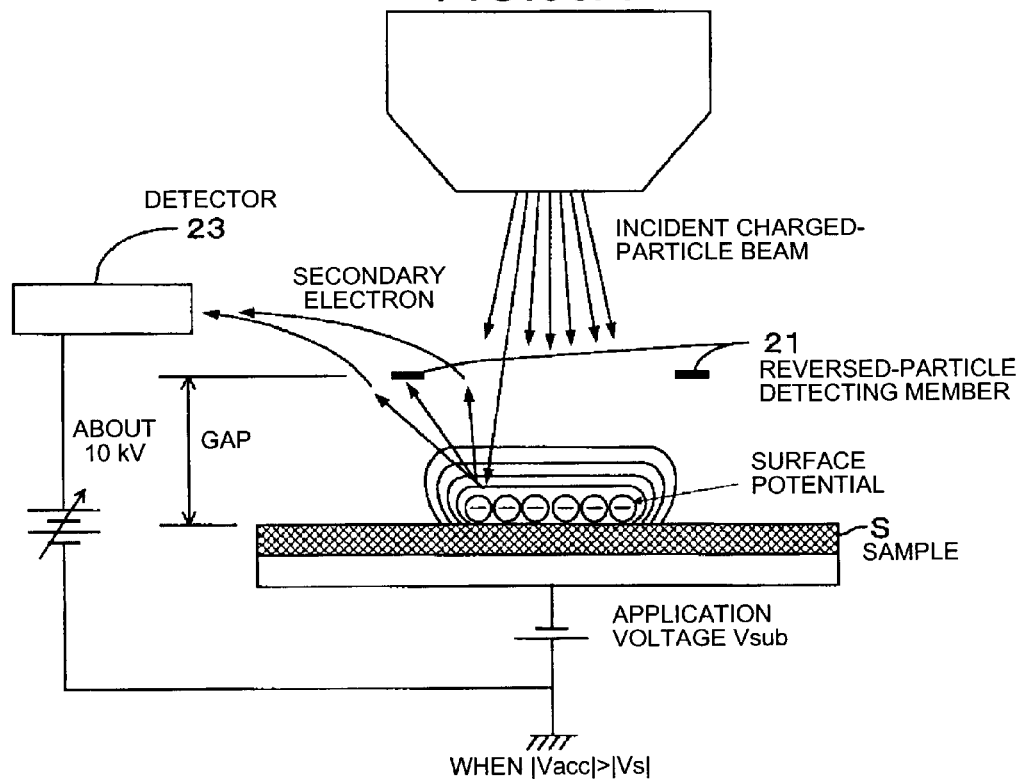
FIGS. 33A to 33C are schematic diagrams for explaining an operation of the surface-potential measuring apparatus when the surface potential of a sample is smaller than an acceleration voltage.
Figure 33B:
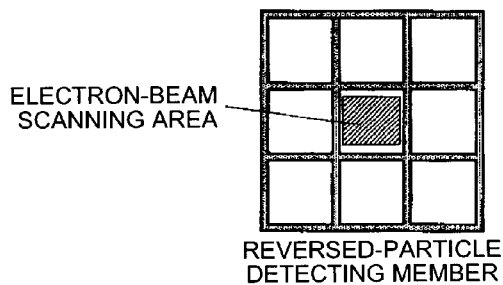
Figure 33C:
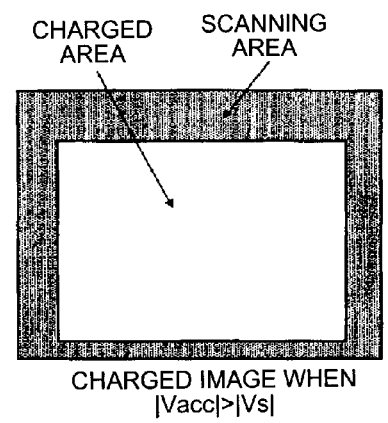

FIG. 33A depicts a configuration of the measuring apparatus when a surface potential |Vs| of the sample S is smaller than the acceleration voltage |Vacc| (i.e., |Vacc|>|Vs|). The reversed-particle detecting member 21 is a grid mesh as shown in FIG. 33B, and has an area smaller than the opening 21a as a beam scanning area. As shown in FIG. 33A, the incident electron reaches the sample S, and the sample S emits the secondary electron. The emitted secondary electron reaches the detector 23 based on the electric field intensity generated by the drawing voltage in the detector 23. In this case, while the secondary electrons colliding against the reversed-particle detecting member 21 cannot be detected, most of the secondary electrons reach the detector 23 and do not form a shade, because the proportion of the secondary electrons that cannot be detected in the total quantity of the secondary electrons is small. Therefore, a charged image as shown in FIG. 33C can be observed.

Figure 34A:
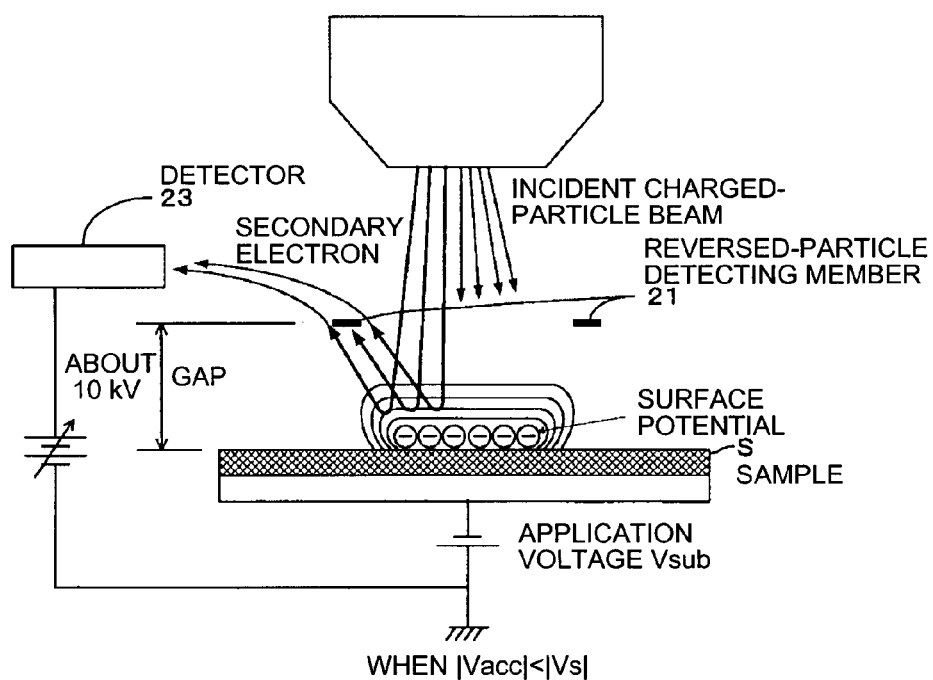
FIGS. 34A to 34C are schematic diagrams for explaining an operation of the surface-potential measuring apparatus when the surface potential of a sample is larger than an acceleration voltage.
Figure 34B:
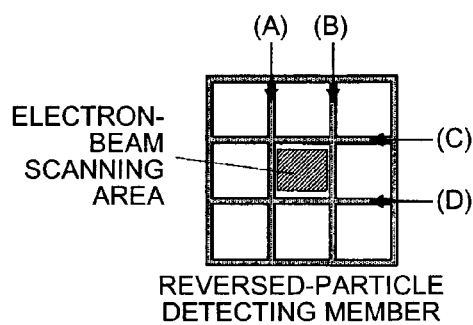
Figure 34C:
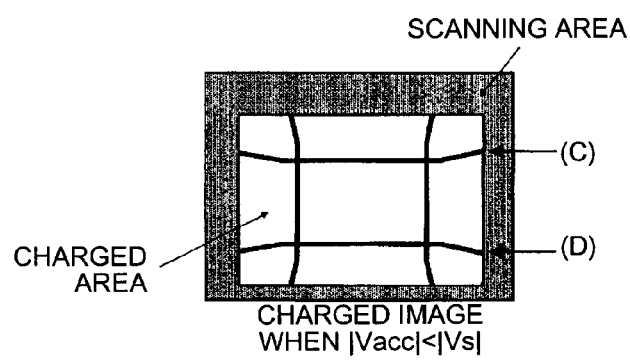

FIG. 34A depicts a configuration of the measuring apparatus when the surface potential |Vs| of the sample S is larger than the acceleration voltage |Vacc| (i.e., |Vacc|<|Vs|). In this case, the reversed-particle detecting member 21 is also a grid mesh as shown in FIG. 34B, and has an area smaller than the opening 21a as a beam scanning area. As shown in FIG. 34A, the incident electron is reversed before reaching the sample S, and attempts to reach the detector 23 based on the electric field intensity generated by the drawing voltage in the detector 23. In this case, there is only one trajectory of the incident electron, unlike when the incident electron reaches the sample S. Therefore, all the incident electrons that collide against the reversed-particle detecting member 21 are stopped by the reversed-particle detecting member 21, and none of the incident electrons can reach the detector 23. Therefore, the detection quantity at this position is extremely small. Accordingly, the incident electrons that collide against the reversed-particle detecting member 21 are not detected in the observed image (charged image), and the observed image becomes dark. As a result, as shown in FIG. 34C, the charged image having a dark part at only the grid mesh against which the incident electrons collide can be observed. Images (A), (B), (C), and (D) of the dark parts correspond to the parts (A), (B), (C), and (D) of the grid shown in FIG. 34B.

As is clear from the above, when the acceleration voltage Vacc is gradually decreased, a change of the secondary electron image to the reversed-electron image can be observed. By identifying the boundary between the secondary electron image and the reversed-electron image (|Vacc|=|Vs|), the surface potential Vs of the sample S can be measured. The method of measuring the potential by changing the acceleration voltage Vacc is particularly effective for the measurement of the surface potential when the sample S is a conductive material.

The acceleration voltage Vacc of the incident electron has a variation of about a few volts in the case of a field-emission type device. When this method is used, a potential of a few hundred to a few thousand volts in a region of 1 millimeter or smaller can be measured in high precision of a few volts. The potential can be measured in higher precision by applying an energy filter to the incident electron.

A method of applying a voltage to the lower surface of the sample S is available to change a relation between the energy of the incident electron and the surface potential of the sample S. In the case of an electrified charge, the surface potential of the sample S can be changed in bias. That is, when the application voltage Vsub of the lower surface of the sample S is changed, with the acceleration voltage Vacc of the incident electron fixed, the actual surface potential becomes Vs+Vsub.

Specifically, assume that the application voltage Vsub is changed from 0 volt to the negative side when the acceleration voltage of the incident electron is Vacc=2 kV and also when the surface potential of the object to be measured using an electrified charge is Vs=−800 V. When Vsub=0 to −1,200 V, a secondary electron is then generated, and a charged image as shown in FIG. 33C is generated. When Vsub<−1,200 V, the incident electron is reversed, and the shade of the grid is observed as shown in FIG. 34C. That is, when Vs=Vacc−Vsub (where the acceleration voltage Vacc<0), the surface potential Vs can be determined as Vacc−Vsub=−2,000 V−(−1,200 V)=−800 V.

Figure 35:
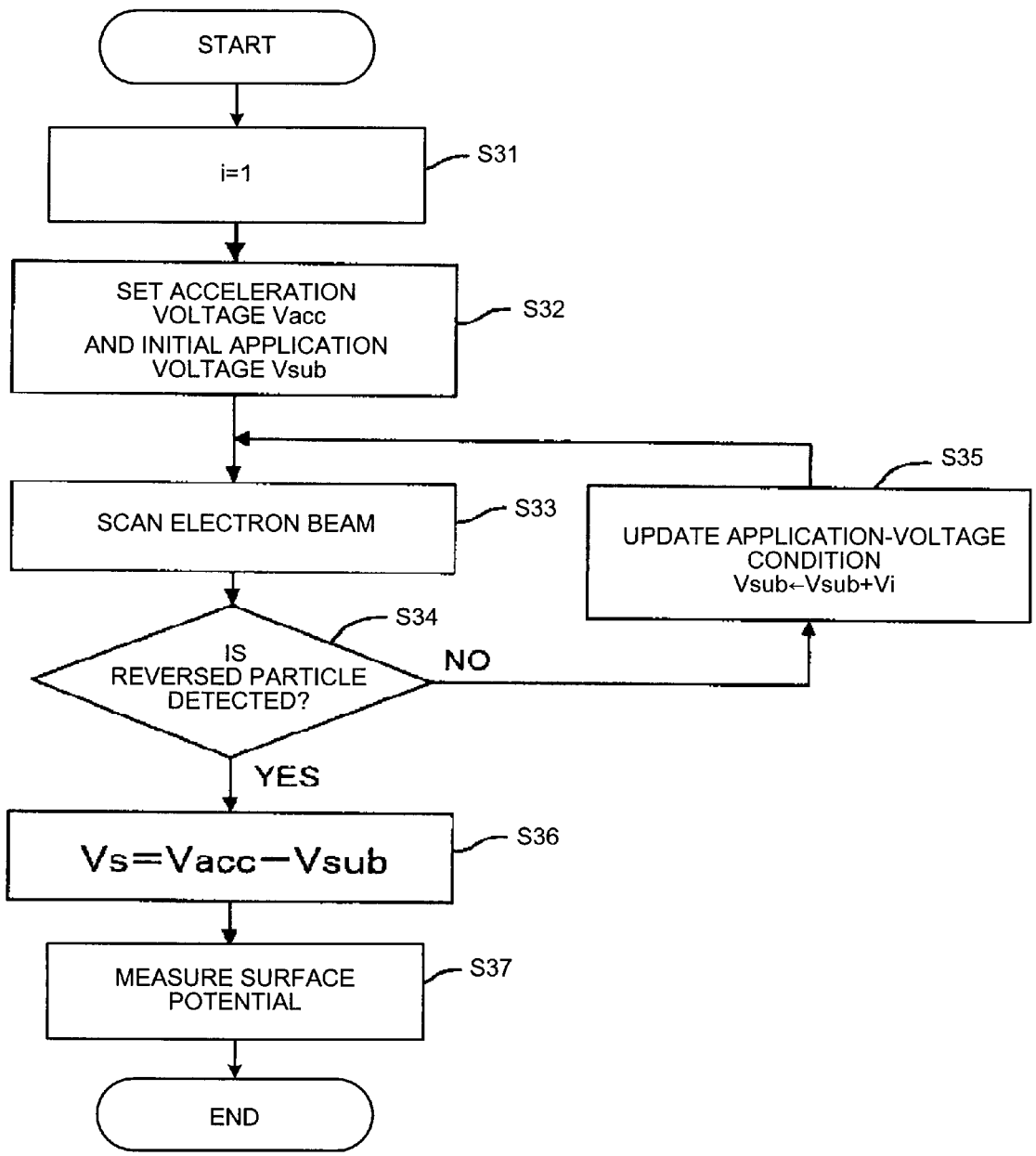
FIG. 35 is a flowchart of a measurement control according to the second embodiment.

FIG. 35 is a flowchart of the measuring control. The index i for assigning the application-voltage condition is set to 1 (step S31), and the acceleration voltage Vacc and the initial application voltage Vsub of the incident electron are set (step S32). The electron beam is scanned (step S33). It is determined whether the reversed particle is detected (step S34). When no reversed particle is detected (NO at step S34), the application-voltage condition is updated (step S35), and the process at step S33 is repeated. When the reversed particle is detected (YES at step S34), the surface potential Vs is determined (step S36), and a measurement value of the surface potential is set (step S37). When the reversed-particle detecting member 21 (grid mesh) is disposed near the surface of the sample S and is grounded to GND, the bending of the incident electron due to the surface potential can be suppressed.

A device is explained below that includes the surface-potential distribution measuring apparatus according to the second embodiment, a unit that generates an electrified charge on the sample by emitting charged particles to the sample, and an optical system that exposes the sample with the charged particles to form an electrostatic latent image. The device scans the sample surface with electron beams, and measures the electrostatic latent image distribution on the sample surface with a detection signal obtained by scanning.

Figure 9C:
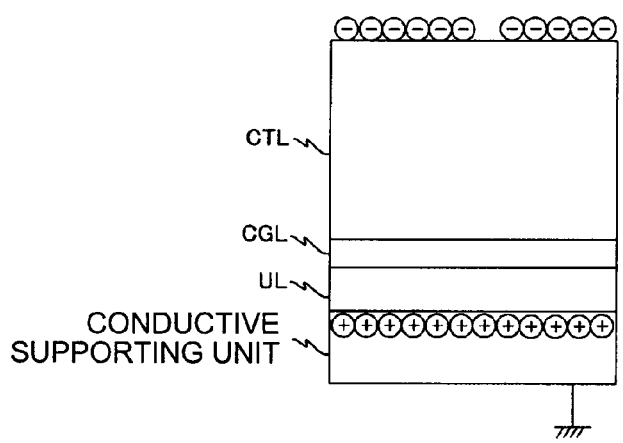

The photoconductor sample S includes a charge generation layer (CGL) and a charge transportation layer (CTL) formed on a conductive supporting unit, as shown in FIGS. 9A to 9C. When the surface is exposed in a state that the surface is charged, a charge generation material (CGM) of the charge generation layer CGL absorbs light, and generates a charge carrier of positive and negative polarities. One part of the carrier is injected into the charge transportation layer CTL and the other part is injected into the conductive supporting unit, depending on the electric field. The carrier injected into the charge transportation layer CTL moves in the charge transportation layer CTL to the surface of the charge transportation layer CTL based on the electric field, and is combined with the charge on the photoconductor surface. The combined carrier disappears. As a result, a charge distribution is formed on the photoconductor surface. That is, the electrostatic latent image is formed. After the electrostatic latent image is formed, the surface charge distribution of the photoconductor sample S is measured in a similar manner.

Figure 36:
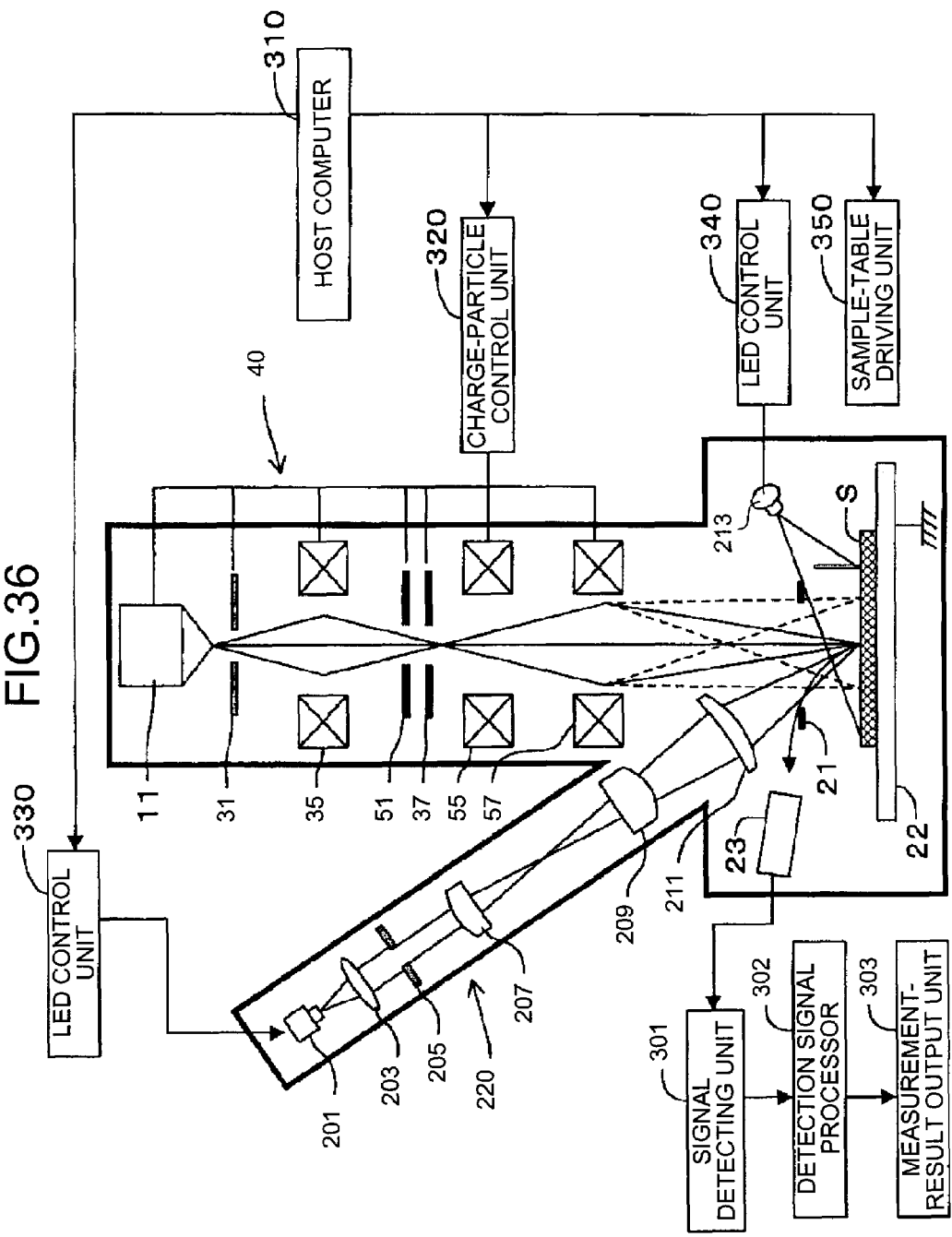
FIG. 36 is a schematic diagram of relevant parts of a measuring apparatus that measures an electrostatic latent image according to the second embodiment.

FIG. 36 is a schematic diagram of another example of the measuring apparatus for a photoconductor's electrostatic latent image according to the second embodiment. The measuring apparatus of a photoconductor's electrostatic latent image includes the charged-particle optical system 40 that emits a charged particle beam, the detecting unit 20, the measuring control unit 300, and the pattern forming device (exposing unit) 220. The charged-particle optical system 40, the detecting unit 20, and the pattern forming device 220 are all disposed within the same chamber, and the inside of the chamber is vacuum. While part of the charged-particle optical system 40 is omitted in FIG. 38, this system has approximately the same configuration as that shown in FIG. 31. Constituent elements that are the same as those in FIG. 31 are denoted with like reference numerals. That is, the charged-particle optical system 40 includes the emitter 11 that generates the electron beam, a suppressor electrode and the extraction electrode 31, the condenser lens 35, the aperture 51, the beam-blanking electrode 37 that turn on/off the electron beam, the scanning lens 55 that scans with the electron beam passing through the beam-blanking electrode 37, and the objective lens 57 that focuses again the electron beam which passes through the scanning lens 55.

The pattern forming device 220 has the same configuration as that in FIG. 19. Each optical system of the exposing unit 220 is adjusted to generate a desired beam diameter and a desired beam profile in the sample S mounted on the sample table 22 of the detecting unit 20. An LD control unit 321 controls the semiconductor laser 201, to emit exposure energy during a proper exposure time. To form a line pattern of an electrostatic latent image on the sample S, a scanning mechanism using a galvano mirror or a polygon mirror can be added to the optical system of the exposing unit 220.

The measuring control unit includes the signal detecting unit 301, the detection-signal processor 302, and the measurement-result output unit 303, like the second embodiment. The measuring control unit further includes a host computer 310, a charge-particle control unit 320 that control the charged-particle optical system 40, an LED control unit 330 that controls the light source 41, an LED control unit 340 that controls the neutralizing LED, and a sample-table driving unit 350 that drives the sample table 22.

The measuring apparatus of a photoconductor's electrostatic latent image forms the electrostatic latent image as follows. First, the measuring apparatus emits an electron beam to the photoconductor sample S to charge this sample S. The acceleration voltage Vb is set to a level higher than the acceleration voltage at which a secondary emission ratio δ becomes 1. With this arrangement, the incident electron quantity exceeds the emission electron quantity, and electrons are accumulated in the photoconductor sample S, thereby generating a charge-up. As a result, the photoconductor sample S can generate a negative charge. By suitably setting the acceleration voltage and the emission time, a desired charge potential can be formed. When the charge potential is formed, the electron beam is once set to off. A contact charge, an injection charge, and an ion emission charge can be also used as other charges.

Figure 37:
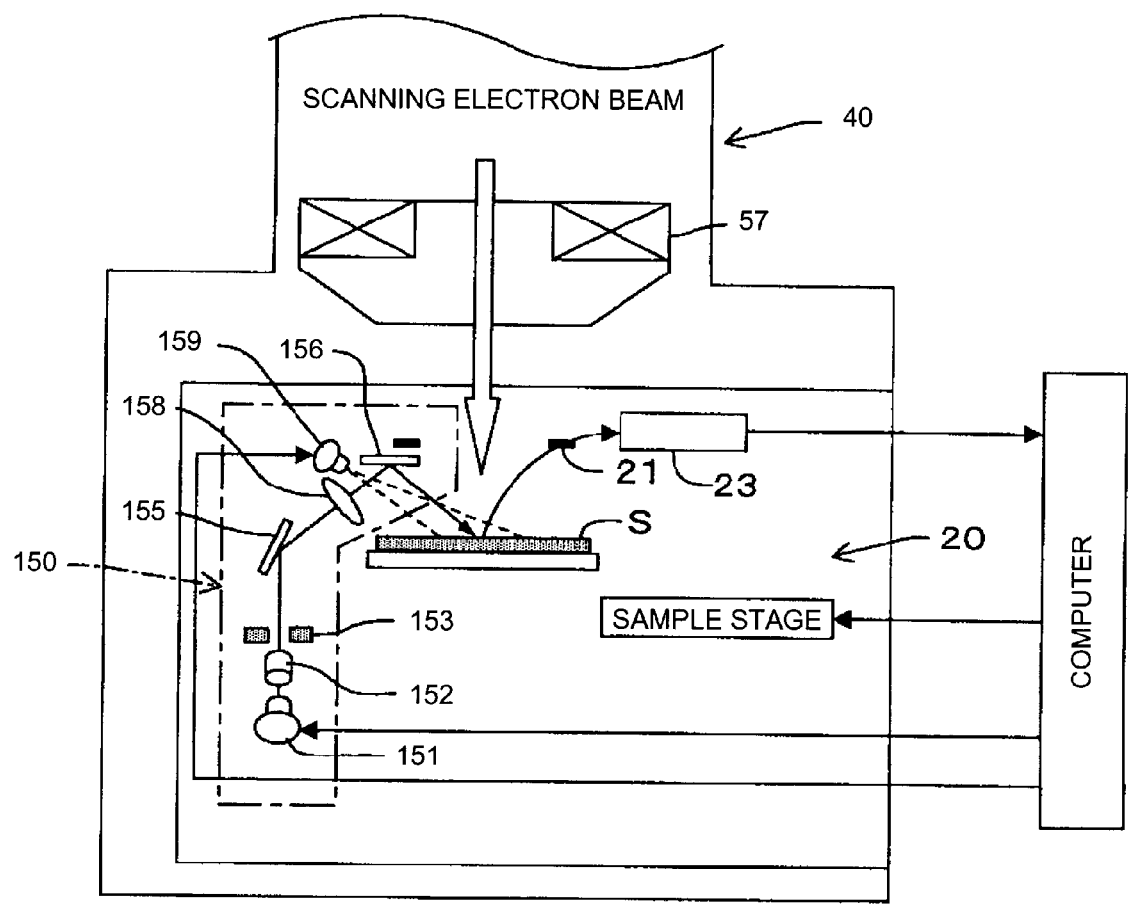
FIG. 37 is an example of an exposing unit according to the second embodiment.

An exposing unit 150 shown in FIG. 37 can be used in place of the pattern forming device 220. The exposing unit 150 includes a semiconductor laser 151, a collimate lens 152, an aperture 153, two fold mirrors 155 and 156, a focusing lens 158, and a neutralizing LED 159. These optical systems are adjusted to generate a desired beam diameter and a desired beam profile in the sample S mounted on the sample table 22 of the detecting unit 20.

Figure 38:
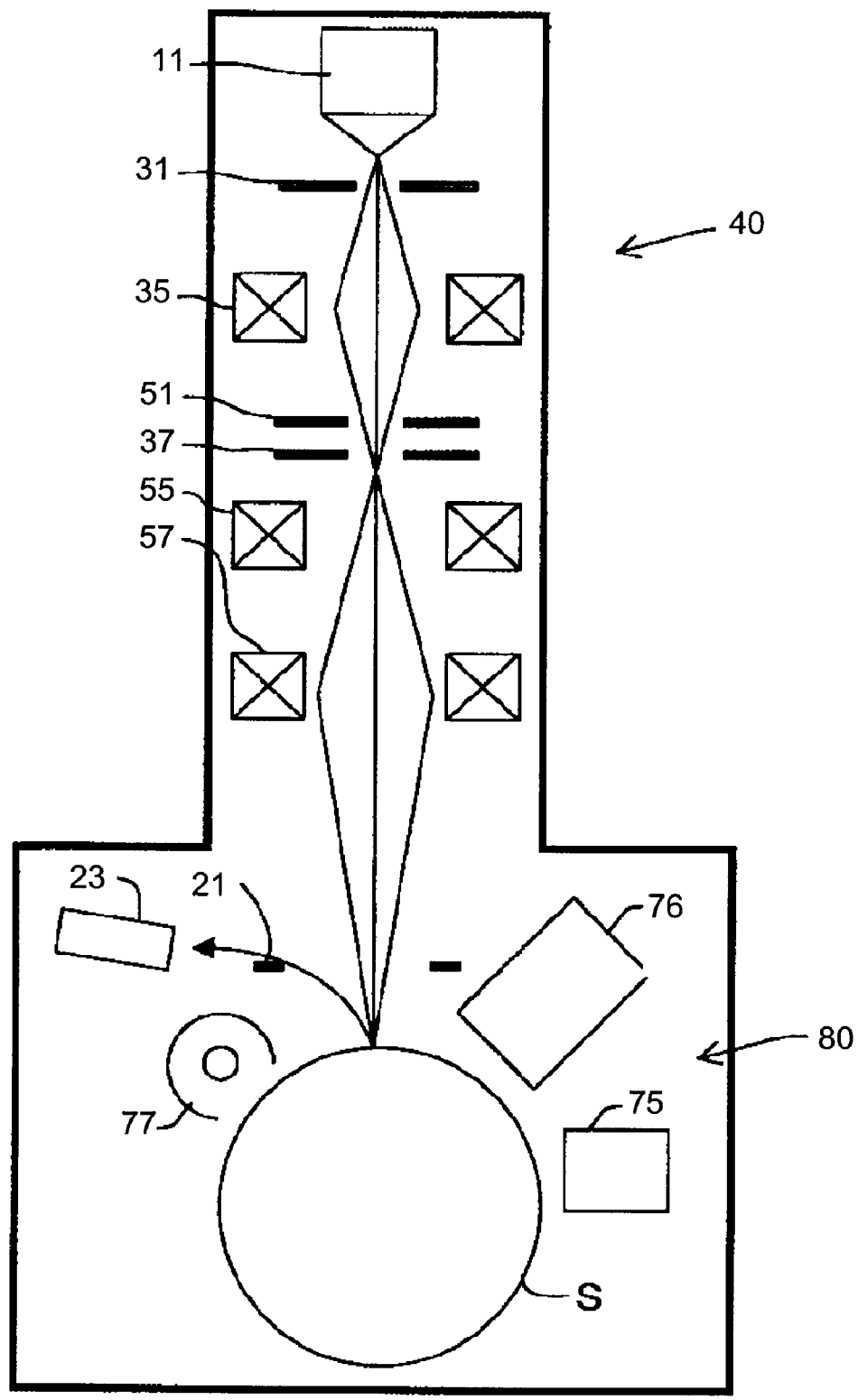
FIG. 38 is a schematic diagram of another example of the exposing unit of the measuring apparatus that measures an electrostatic latent image on an image carrier in a cylindrical shape according to the second embodiment.

While the photoconductor sample S in the second embodiment is explained to have a plane shape, the photoconductor sample S can also have a curved surface. That is, the photoconductor sample S used as the image carrier in the image forming apparatus has a cylindrical shape in general. The photoconductor sample S can have a configuration as shown in FIG. 38, as a cylindrical shape. The charged-particle optical system 40 that emits the charged particle beam in the measuring apparatus of the photoconductor's electrostatic latent image is similar to that shown in FIG. 37, and has the reversed-particle detecting member 21, the detector 23, the exposing unit 76, and the neutralizing unit 77, within a detecting unit 80. The charged-particle optical system 40 and the detecting unit 80 are all disposed within the same chamber, and the inside of the chamber is vacuum.

When a scanning mechanism is added to the exposing unit 76 as shown in FIG. 29, the exposing unit 76 can form an optional latent image pattern including a line pattern, in a bus line direction of the photoconductor sample S.

When a laser beam is emitted along the bus line of the photoconductor sample S, an optional latent image pattern including the line pattern can be formed in the bus line direction of the photoconductor sample S.

When a charge distribution is present on the surface of the photoconductor sample S, an electric field distribution according to the surface charge distribution is formed in space. Therefore, the secondary electron generated by the incident electron is pushed back to this electric field, and the quantity of the secondary electron reaching the detector decreases. Accordingly, the exposed part of the charge leaked part turns white, and the non-exposed part turns black, thereby making it possible to obtain a contrast image according to the surface charge distribution.

The measuring principle of the potential distribution in the second embodiment can be explained with reference to FIGS. 30A and 30B. In FIG. 30A, the surface of the sample is in a state of being uniformly charged in the negative polarity except the part where the potential is attenuated by the optical attenuation. Because the positive polarity is given to the charged-particle trapper (corresponding to the detector 23), the potential becomes higher from the surface of the sample toward the charged-particle trapper, in the potential contour lines indicated by the solid lines. Therefore, the secondary electrons e11 and e12 generated at the points Q1 and Q2 in FIG. 30A as "the parts uniformly charged in the negative polarity" of the sample are drawn to the positive potential of the charged-particle trapper. As a result, the secondary electrons e11 and e12 are displaced as shown in the arrowheads G1 and G2, and are trapped in the charged-particle trapper.

On the other hand, in FIG. 30B, the point Q3 is "the part where the light is irradiated and the negative potential is attenuated". The layout of the potential contour lines near the point Q3 is "as shown by the broken lines". In the potential distribution of this part, "the potential becomes higher nearer the point Q3". That is, electric force constrained to the sample SP side works in the secondary electron e13 generated near the point Q3, as indicated by the arrowhead G3. Therefore, the secondary electron e13 is trapped in "the hole of the potential" indicated by the broken-line potential contour lines, and does not move toward the charged-particle trapper. FIG. 30B schematically depicts the "hole of the potential".

That is, the part having high intensity of the secondary electrons (a large number of secondary electrons) detected by the charged-particle trapper corresponds to "the ground part of the electrostatic latent image (the part uniformly charged in negative, i.e., the parts as represented by the points Q1 and Q2 in FIG. 30A)". The part having low intensity corresponds to "the part irradiated with light, i.e., the part as represented by the point Q3 in FIG. 30A)". Therefore, when a signal processor samples in a suitable sampling time the electric signal obtained by a secondary-electron detecting unit, the surface potential distribution V(X, Y) can be specified for each "fine region corresponding to the sampling", using the sampling time T as a parameter, as described above. The signal processor structures the surface potential distribution V(X, Y) as two-dimensional image data. When the output device outputs this two-dimensional image data, the electrostatic latent image can be obtained as a visible image.

For example, when the intensity of the trapped secondary electron is "expressed as contrast of brightness", the image part of the electrostatic latent image becomes dark and the ground part becomes bright, thereby forming a contrast. Accordingly, the image can be expressed (output) as a contrast image corresponding to the surface charge distribution. When the surface potential distribution is known, the surface charge distribution can be also known. While the electrostatic latent image actually projected to the sample is fine, the image output from the output device can be appropriately expanded to "a size suitable for observation".

FIGS. 8A to 8C are examples of a surface potential distribution Vs(x) generated by the charge distribution on the sample surface. For convenience sake, this Vs(x) expresses a surface potential distribution in the state that the opposite surface of the dielectric sample having a charge distribution is in the grounded (GND) state. The potential increases in the negative direction from the center potential toward the outside. FIGS. 8A and 8B express detection signals when the sample is scanned two-dimensionally. The white part expresses that the detection quantity is large, and the black part expresses that the detection quantity is small.

It is assumed that Vth=Vacc−Vsub. When Vacc=−1.8 kV and when the acceleration voltage of electron is Vsub=−1,200 V, a result of the observation becomes as shown in FIG. 8A. A boundary of a difference in detection quantities, i.e., a boundary between the white part and the black part, forms a contour line having Vs(x)=−600 V as a threshold level potential. This contrast image is expressed as a contrast image of Vth=−600 V. When Vsub=−1,050 V, the incident electron has a high probability of reaching the sample than that when Vsub=−1,200 V, by a portion of higher energy, and the area where the speed of the incident electron is reversed decreases and the black part increases. Therefore, a contrast image of Vth=−750 V can be obtained.

By calculating in advance the surrounding electrostatic environment and the electron trajectory, and by correcting charges, the measuring precision of the latent image potential can be improved. By detecting a brightness contrast image while changing the acceleration voltage of the incident electron or the voltage applied to the lower part of the sample as described above, the latent image profile can be measured. By measuring the charged potential in the above method before the exposure, the potential distribution of the electrostatic latent image of the photoconductor can be measured.

It is explained below that, in evaluating the resistance insulation, the charge leakage of a size equal to or larger than 5 micrometers does not occur when the electric field intensity applied in the thickness direction of the sample is equal to or smaller than 10 V/µm by using the measuring method or the measuring apparatus according to the second embodiment.

According to the second embodiment, whether the sample has generated an electrostatic discharge damage and where this electrostatic discharge damage has occurred can be specified. The insulation resistance can be also evaluated. This method is particularly suitable to evaluate an image carrier such as the photoconductor among the dielectric substances. By feeding back the evaluation result to the design, a photoconductor having high durability can be provided.

First, an electron beam is emitted to the photoconductor sample. An acceleration voltage E1 is set to a level higher than an acceleration voltage E0 at which the secondary electron-emission ratio δ becomes 1. With this arrangement, the incident electron quantity exceeds the emission electron quantity, and electrons are accumulated in the photoconductor sample, thereby generating a charge-up. As a result, the photoconductor sample can uniformly generate a negative charge. By suitably setting the acceleration voltage and the emission time, a desired charge potential can be formed.

By charging the photoconductor in this way, the electric field intensity can be given to the thickness direction of the photoconductor sample. The highly durable photoconductor preferably has electric field intensity equal to or higher than 10 V/μm applied to the thickness direction of the photoconductor sample, as the insulation resistance. To confirm this, the occurrence of charge leakage can be evaluated by applying a charged potential of the electric field intensity equal to or higher than 10 V/μm to the thickness direction of the photoconductor sample. Because the size of the toner is about 5 micrometers at the minimum, charge leakage larger than this can be disregarded. When there is no charge leakage equal to or larger than 5 micrometers, it can be assumed that there is no charge leakage. As explained above, the surface potential can be measured accurately, and the insulation resistance of the photoconductor sample can be evaluated.

Figure 39:
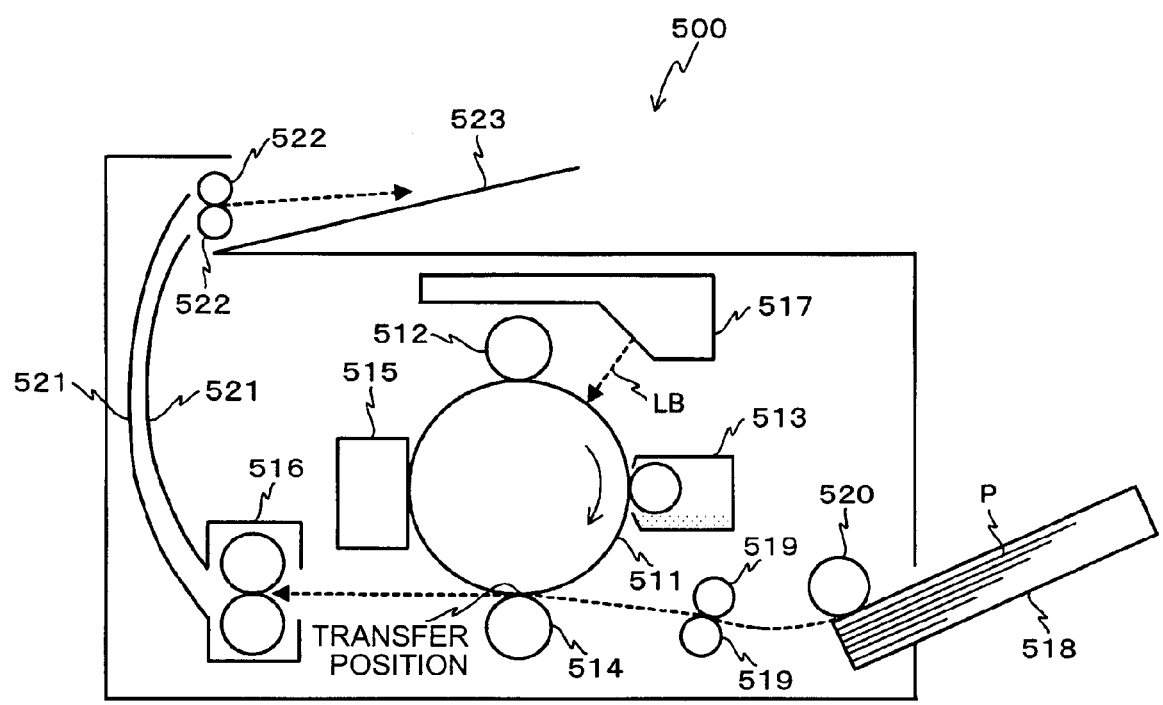
FIG. 39 is a schematic diagram for explaining a laser printer having a photoconductor of which withstand voltage performance and resolution are evaluated.

FIG. 39 is a schematic diagram of a laser printer 500 as the image forming apparatus according to the embodiments of the present invention.

This laser printer 500 includes a photosensitive drum 511, a charge roller 512, a developing device 513, a transfer roller 514, a cleaning device 515, a fixing device 516, an optical scanning device 517, a cassette 518, a pair of resist rollers 519, a paper-supply roller 520, a pair of paper-ejection rollers 522, and a tray 523.

The charge roller 512, the developing device 513, the transfer roller 514, and the cleaning device 515 are disposed near the surface of the photosensitive drum 511, respectively. The charge roller 512, the developing device 513, the transfer roller 514, and the cleaning device 515 are disposed in this order, along the rotation direction of the photosensitive drum 511.

The photosensitive drum 511 is an image carrier that is evaluated to have sufficient insulation resistance performance and corresponding resolution as described above. A photosensitive layer having photoconductivity is formed on the surface of the photosensitive drum 511. To form an image, the photosensitive drum 511 is rotated at an equal speed in the clockwise (arrowhead direction) on the plane in FIG. 39.

The charge roller 512 is a charging unit that uniformly charges the surface of the photosensitive drum 511. A "corona charger" can be used for the charging unit.

The optical scanning device 517 emits light LB modulated based on image information from a higher-order device (e.g., a personal computer), to the surface of the photosensitive drum 511 charged by the charge roller 512, thereby exposing the surface with optical writing. With this arrangement, only part of the surface of the photosensitive drum 511 irradiated with light disappears, and a latent image (electrostatic latent image) corresponding to the image information is formed on the surface of the photosensitive drum 511. The formed latent image is a negative latent image, and moves to a direction of the developing device 513 along the rotation of the photosensitive drum 511. The longitudinal direction (direction along the rotation axis) of the photosensitive drum 511 is referred to as a "main scanning direction", and the rotation direction of the photosensitive drum 511 is referred to as a "sub-scanning direction".

The developing device 513 has a toner cartridge storing toner, and makes the toner adhere to only part of the surface of the photosensitive drum 511 irradiated with light. That is, the developing device 513 makes the toner adhere to the latent image formed on the surface of the photosensitive drum 511 to develop the image of the image information. The latent image adhered with toner (toner image) moves to the direction of the transfer roller 514 along the rotation of the photosensitive drum 511.

The cassette 518 is detachable to the body of the laser printer 500, and contains transfer sheets P as an object onto which the image is to be transferred. The paper-supply roller 520 is disposed near the cassette 518, and takes out the top one of the transfer sheets P in the cassette 518.

The pair of resist rollers 519 are disposed near the transfer roller 514, and convey the transfer sheet from the paper-supply roller 520 to a nip between the transfer roller 514 and the photosensitive drum 511 in conformity with the timing of movement of the toner image on the photosensitive drum 511 to a transfer position. The transfer roller 514 electrostatically transfers the toner image onto the transfer sheet.

The transfer sheet with the toner image is conveyed to the fixing device 516. The fixing device 516 fixes the toner image. The pair of paper-ejection rollers 522 eject the transfer sheet fixed with the toner image onto the tray 523 via a conveying route 521.

The surface of the photosensitive drum 511 transferred with the toner image is cleaned with the cleaning device 515, and residual toners and paper powders are removed.

As explained above, the laser printer 500 includes the photosensitive drum 511 which is evaluated to have sufficient insulation resistance performance and corresponding resolution. Therefore, a high-quality image can be formed. As a result, an image forming apparatus with excellent resolution, and having high precision, highly durability, and high reliability can be provided.

According to an embodiment of the present invention, when a sample is scanned with a beam of charged particles, at least part of the charged particles collides against a particle emitting member via the sample. The particle emitting member emits charged particles corresponding to the number of the collided charged particles. A detecting unit detects at least part of the charged particles. Based on a detection result obtained by the detecting unit, a calculating unit obtains a distribution state of surface potential of the sample. Thus, the detecting unit can output a signal of a higher S/N ratio. As a result, the surface potential distribution of the sample can be measured with high precision.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface-potential distribution measuring apparatus that measures a potential distribution of a latent image on a surface of a sample by scanning the surface with a beam of charged particles, the surface-potential distribution measuring apparatus comprising:

an image forming unit that forms the latent image on the surface of the sample by distributing a charge potential on the surface of the sample;

a beam generating unit that generates a beam of charged particles;

an optical system that is located between the beam generating unit and the sample, and focuses the beam from the beam generating unit to the surface of the sample;

a particle emitting member that is located near the sample to be collided with at least part of the charged particles via the sample, and emits secondary charged particles corresponding to number of collided charged particles;

a detecting unit that detects at least part of the secondary charged particles; and a calculating unit that calculates the potential distribution of a latent image pattern formed on the surface of the sample by the image forming unit based on a detection result obtained by the detecting unit.

2. The surface-potential distribution measuring apparatus according to claim 1, wherein the particle emitting member faces the detecting unit.

3. The surface-potential distribution measuring apparatus according to claim 1, wherein the particle emitting member is located between the optical system and the sample, and includes an opening which the beam can pass through.

4. The surface-potential distribution measuring apparatus according to claim 3, wherein a diameter of the opening is equal to or smaller than 2 millimeters.

5. The surface-potential distribution measuring apparatus according to claim 1, wherein the particle emitting member has a smooth surface against which at least part of the charged particles collides.

6. The surface-potential distribution measuring apparatus according to claim 1, wherein the particle emitting member includes a first surface against which at least part of the charged particles collides, and a second surface on which a conductive film is formed, the second surface being opposite to the first surface.

7. The surface-potential distribution measuring apparatus according to claim 1, further comprising:
    a voltage applying unit that applies a voltage to the particle emitting member, and optimizes a ratio at which the particle emitting member emits the secondary charged particles.

8. The surface-potential distribution measuring apparatus according to claim 1, wherein the charged particles that collides with the particle emitting member via the sample have been repulsed near the surface of the sample before reaching the surface of the sample.

9. The surface-potential distribution measuring apparatus according to claim 1, further comprising:
    a latent-image forming unit that forms a latent image on the surface of the sample.

10. A surface-potential distribution measuring apparatus that measures potential distribution on a surface of a sample by scanning the surface with a beam of charged particles, the surface-potential distribution measuring apparatus comprising:
    an image forming unit that forms a latent image on the surface of the sample by distributing a charge potential on the surface of the sample;
    a beam generating unit that generates a beam of charged particles;
    an optical system that is located between the beam generating unit and the sample, and focuses the beam from the beam generating unit to the surface of the sample;
    a reversed-particle detecting unit that is located near the sample and detects a repulsive particle which is in the beam of charged particles proceeding to the sample and is repulsed without reaching the sample; and
    a calculating unit that calculates potential distribution of a latent image pattern formed on the surface of the sample by the image forming unit based on a detection result obtained by the reversed-particle detecting unit.

11. The surface-potential distribution measuring apparatus according to claim 10, wherein the detecting unit is in a meshed configuration.

12. The surface-potential distribution measuring apparatus according to claim 11, wherein the detecting unit is made of nonmagnetic conductive material.

13. The surface-potential distribution measuring apparatus according to claim 10, wherein the detecting unit is located at least 0.1 millimeter above the surface of the sample.

14. The surface-potential distribution measuring apparatus according to claim 10, further comprising:
    a voltage control unit that changes an acceleration voltage of the beam.

15. The surface-potential distribution measuring apparatus according to claim 10, further comprising:
    a bias control unit that changes surface potential bias.

* * * * *